United States Patent
Kobayashi et al.

(10) Patent No.: US 6,690,493 B1
(45) Date of Patent: Feb. 10, 2004

(54) PHOTOELECTRIC CONVERSION DEVICE AND DRIVING METHOD THEREFOR

(75) Inventors: Isao Kobayashi, Atsugi (JP); Yutaka Endo, Utsunomiya (JP); Noriyuki Kaifu, Hachioji (JP); Toshio Kameshima, Sagamihara (JP); Toshikazu Tamura, Utsunomiya (JP); Hideki Nonaka, Utsunomiya (JP); Takashi Ogura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 287 days.

(21) Appl. No.: 09/691,065

(22) Filed: Oct. 19, 2000

Related U.S. Application Data

(62) Division of application No. 08/803,422, filed on Feb. 20, 1997, now Pat. No. 6,163,386.

(30) Foreign Application Priority Data

| | | | |
|---|---|---|---|
| Feb. 22, 1996 | (JP) | ............................................. | 8-34901 |
| Feb. 22, 1996 | (JP) | ............................................. | 8-34902 |
| Mar. 29, 1996 | (JP) | ............................................. | 8-78017 |
| Feb. 13, 1997 | (JP) | ............................................. | 9-28711 |

(51) Int. Cl.[7] ........................... H04N 1/04; H04N 5/335
(52) U.S. Cl. ...................... 358/482; 358/453; 348/307
(58) Field of Search ............................... 358/483, 482, 358/513, 514, 453, 487; 250/208.1; 348/307, 308, 243, 298

(56) References Cited

U.S. PATENT DOCUMENTS

| | | | |
|---|---|---|---|
| 4,910,599 A | 3/1990 | Hashimoto | ................... 348/304 |
| 4,939,578 A | * 7/1990 | Kano | .......................... 358/482 |
| 4,996,413 A | 2/1991 | McDaniel et al. | ........ 250/208.1 |
| 5,027,226 A | * 6/1991 | Nagata et al. | ............... 358/482 |
| 5,060,071 A | * 10/1991 | Ino | .............................. 358/482 |
| 5,262,871 A | 11/1993 | Wilder et al. | ................ 348/307 |
| 5,412,422 A | 5/1995 | Yamada et al. | .............. 348/218 |
| 5,452,004 A | 9/1995 | Roberts | ........................ 348/301 |
| 5,640,251 A | * 6/1997 | Tone et al. | .................. 358/482 |
| 6,163,386 A | * 12/2000 | Kobayashi et al. | .......... 358/482 |

FOREIGN PATENT DOCUMENTS

| | | |
|---|---|---|
| EP | 0282993 | 9/1988 |
| EP | 0527004 | 2/1993 |
| EP | 0660421 | 6/1995 |
| WO | 95-01048 | 1/1995 |
| WO | 95-33333 | 12/1995 |

* cited by examiner

Primary Examiner—Cheukfan Lee
(74) Attorney, Agent, or Firm—Fitzpatrick, Cella, Harper & Scinto

(57) ABSTRACT

In a photoelectric conversion device for reading signals in succession from plural photoelectric converting elements (S11–S33), arranged two-dimensionally on a substrate, by successively scanning drive lines (g1–g3) in the X-direction thereby transferring signals charges along signal lines in the Y-direction, for reading the signals of the photoelectric converting elements in a partial area, only the arbitrarily selected drive lines for the plural photoelectric converting elements are scanned in succession while the remaining drive lines are not driven or are driven simultaneously for transferring the charges at a timing different from the timing of drive of the arbitrarily selected drive lines.

9 Claims, 19 Drawing Sheets

PHOTOELECTRIC CONVERSION DEVICE AND DRIVING METHOD THEREFOR

This application is a division of application Ser. No. 08/803,422, filed Feb. 20, 1997, now allowed, U.S. Pat. No. 6,163,386.

BACKGROUND OF THE INVENTION

1. Field of the Invention

The present invention relates to a photoelectric conversion device and a driving method therefor, and more particularly to a photoelectric conversion device provided with a two-dimensional array of reading pixels, adapted for use in a facsimile apparatus, a digital copying apparatus of an X-ray image capture device, and a driving method therefor.

2. Related Background Art

An image reading system utilizing a reduction optical system and a CCD sensor has been conventionally employed for the image capture in the facsimile apparatus, digital copying apparatus or X-ray image capture device, but, based on the recent development of photoelectric semiconductor materials exemplified by hydrogenated amorphous silicon (hereinafter referred to as a-Si), there are conducted active developments for so-called contact sensors having photoelectric converting elements and signal processing units on a large-sized substrate to enable image reading with an optical system of a size same as that of the information source. Particularly a-Si, being usable not only as a-photoelectric converting material but also in a thin film field effect transistor (hereinafter written as TFT), provides an advantage that the photoelectric converting semiconductor layer and the semiconductor layer of TFT can be formed simultaneously.

However, in such photoelectric conversion devices, in case of reading a partial area (hereinafter called trimming operation), it is required to drive all the drive lines or all the pixels to read the outputs of all the pixels and then to extract the signals corresponding to the certain required area. For this reason there is encountered a drawback of requiring time for driving the unnecessary drive lines and time for reading the unnecessary output signals.

In case the photoelectric conversion device is of a large area with pixels of a high definition as in the X-ray image capture device, particularly in case of capturing information of a large number of pixels of a high definition as so-called moving image as in the case of observing the image while irradiating the X-ray image capture device continuously with X-rays, such drawback becomes serious because of the significant signal processing time and also because of the increased X-ray radiation dose in case of the X-ray image capture.

SUMMARY OF THE INVENTION

An object of the present invention is to provide a photoelectric conversion device including a two-dimensional array of plural photoelectric converting elements, capable of high-speed signal reading, and a driving method therefor.

Another object of the present invention is to provide a photoelectric conversion device, including an array of plural photoelectric converting elements, not requiring time for driving the unnecessary drive lines and time for reading unnecessary output signals in case of reading the signals of the photoelectric converting elements of a partial area (such reading operation being hereinafter called a trimming operation).

Still another object of the present invention is to provide a photoelectric conversion device enabling image reading with a higher sensitivity, usable as an X-ray image capture device with a reduced X-ray radiation dose, and a drive method therefor.

Still another object of the present invention is to provide a drive method for a photoelectric conversion device in which signals of plural photoelectric converting elements arranged in a two-dimensional array on a substrate are successively read by scanning the drive lines in X-direction in succession and transferring the signal charges in the signal lines in the Y-direction, wherein the signal charge transfer is executed by scanning in succession only arbitrarily selected drive lines among those for the plural photoelectric converting elements, while not driving the remaining drive lines for the signal charge transfer or driving the remaining plural drive lines simultaneously at a timing different from that for the above-mentioned arbitrary drive lines.

Still another object of the present invention is to provide a drive method for such photoelectric conversion device, wherein potentials at both ends of each of the photoelectric converting elements in the remaining drive lines are simultaneously returned to an initial value.

Still another object of the present invention is to provide a drive method for such photoelectric conversion device, wherein such remaining drive lines are driven either collectively or in a divided manner.

Still another object of the present invention is to provide a drive method for such photoelectric conversion device, wherein the drive lines execute a drive for initializing all the photoelectric converting elements after the aforementioned arbitrary drive lines execute transfer of the signal charges obtained by the photoelectric conversion in the corresponding photoelectric converting elements.

Still another object of the present invention is to provide a drive method having a mode for reading the signals by driving the aforementioned arbitrary drive lines and another mode for reading the signals by driving second arbitrary drive lines different from the above-mentioned arbitrary drive lines, and a drive method in which the above-mentioned two modes are executed alternately.

Still another object of the present invention is to provide a drive method wherein the aforementioned arbitrary drive lines are selected in a plural number and such selected drive lines are driven in succession from the innermost one toward the outermost one, and/or the aforementioned arbitrary drive lines are selected in a plural number and a drive is executed for initializing the selected drive lines in succession from the innermost one toward the outermost one prior to the reading of the signal charges by the drive lines.

Still another object of the present invention is to provide a drive method for reading image data from a photoelectric conversion device including a photodetector array consisting of a matrix array of photosensor elements, comprising the steps of:

a) determining, as an object area of the user, an area of the photosensor elements defined by a desired range of rows and a desired range of columns in the photodetector array;

b) detecting the signals of the photosensor elements of at least a row, from the side of one of the mutually opposed edges, in the direction of row, of the object area;

c) detecting the signals of the photosensor elements of at least a row, from the side of the other of the mutually opposed edges, in the direction of row, of the object area; and d) alternately repeating the steps b) and c), except for the already detected rows, until the signals of the photosensor elements of the row at the central portion of the object area are detected.

Still another object of the present invention is to provide a drive method for reading image data from a photoelectric conversion device including a photodetector array consisting of a matrix array of photosensor elements, comprising the steps of:

a) determining, as an object area of the user, an area of the photosensor elements defined by a desired range of rows and a desired range of columns in the photodetector array;

b) detecting signals of the photosensor elements of at least a row in a central portion of the object area;

c) detecting signals of the photosensor elements of at least a row adjacent to one of the two sides of the already detected row;

d) detecting signals of the photosensor elements of at least a row adjacent to the other of the two sides of the already detected row; and e) alternately repeating the steps of c) and d), except for the already detected rows, until the signals of the photosensor elements of the rows on the mutually opposed edges, in the direction of row, of the object area are detected.

Still another object of the present invention is to provide a drive method for driving a photoelectric conversion device which is provided with a photodetector array consisting of a matrix array of photosensor elements and in which signals from at least a part of the photosensor elements of each column are taken out from a common column output line through switching elements, comprising the steps of:

a) determining, as an object area of the user, an area of the photosensor elements defined by a desired range of rows and a desired range of columns in the. photodetector array;

b) taking out the signals to the column output line by driving a switch element corresponding to the photosensor elements of at least a row, from the side of one of the mutually opposed edges, in the direction of row, of the object area;

c) taking out the signals to the column output line by driving a switch element corresponding to the photosensor elements of at least a row, from the side of the other of the mutually opposed edges, in the direction of row, of the object area; and d) alternately repeating the steps b) and c), except for the already detected rows, until the signals of the photosensor elements of the row at the central portion of the object area are detected.

Still another object of the present invention is to provide a drive method for driving a photoelectric conversion device which is provided with a photodetector array consisting of a matrix array of photosensor elements and in which signals from at least a part of the photosensor elements of each column are taken out from a common column output line through switching elements, comprising the steps of:

a) determining, as an object area of the user, an area of the photosensor elements defined by a desired range of rows and a desired range of columns in the photodetector array;

b) taking out the signals to the column output line by driving a switch element corresponding to the photosensor elements of at least a row at the central portion of the object area;

c) taking out the signals to the column output line by driving a switch element corresponding to the photosensor elements of at least a row adjacent to one of the side of the already detected row;

d) taking out the signals to the column output line by driving a switch element corresponding to the photosensor elements of at least a row adjacent to the other of the side of the already detected row; and e) alternately repeating the steps c) and d), except for the already detected rows, until the switch elements corresponding to the photosensor elements of the rows at the mutually opposed edges, in the direction of row, of the object area are driven.

Still another object of the present invention is to provide a photoelectric conversion device provided with a photodetector array composed of a matrix array of photosensor elements and including a signal charge accumulation unit corresponding to each photosensor element and a switch unit provided in the signal output path from such signal charge accumulation unit, the device comprising:

object area determination means for determining, as an object area of the user, an area of the photosensor elements defined by a desired range of rows and a desired range of columns in the photodetector array, and drive means for generating a drive signal for the photodetector array based on the output of the object area determination means;

wherein the drive means is adapted to generate the drive signal for the photodetector array in such a manner as to reset the charges of the signal charge accumulation units by driving the switch units of the photodetector array in succession from a row at the periphery of the object area to a row at the center thereof, and, after the exposure to the light, to read the signal charges of the signal charge accumulation units by driving the switch units of the photodetector array in succession from the central portion of the object area to the peripheral portion thereof.

Still another object of the present invention is to provide a photoelectric conversion device comprising read instruction detecting means for detecting a read instruction, and control means for controlling the aforementioned drive means based on the output of the read instruction detecting means, wherein the control means is adapted to effect the resetting, the exposure after the resetting and the signal charge reading after the exposure based on the output of the read instruction detecting means, and to provide a photoelectric conversion device further comprising conversion means for converting an X-ray, emitted from X-ray irradiation means, into a visible light, and adapted to detect the visible light, emitted from the conversion means, by the photodetector array.

Still another object of the present invention is to provide a photoelectric conversion device, wherein the drive means is adapted to generate drive signals for the photodetector array, in such a manner as to refresh the signal charge accumulation units by driving the switch units of the photodetector array in succession from a row in the peripheral portion of the object area to a row at the central portion thereof.

Still another object of the present invention is to provide a photoelectric conversion device for reading the signals in succession from plural photoelectric converting elements arranged two-dimensionally on a substrate, by scanning the drive lines of the X-direction in succession thereby transferring the signal charges in the Y-direction, comprising means for successively scanning the arbitrary drive lines only of the above-mentioned plural photoelectric converting elements.

Still another object of the present invention is to provide such photoelectric conversion device comprising means for simultaneously driving the remaining drive lines at a timing different from the drive timing for the above-mentioned arbitrary drive lines.

BRIEF DESCRIPTION OF THE DRAWINGS

FIGS. 1A and 1B are schematic cross-sectional views of examples of the photoelectric converting element, while

FIG. 5A is a schematic plan view of a pixel of the photoelectric conversion device, while

DETAILED DESCRIPTION OF THE PREFERRED EMBODIMENTS

At first there will be explained an example of the photosensor element in which the present invention is applicable.

Figure 1A:
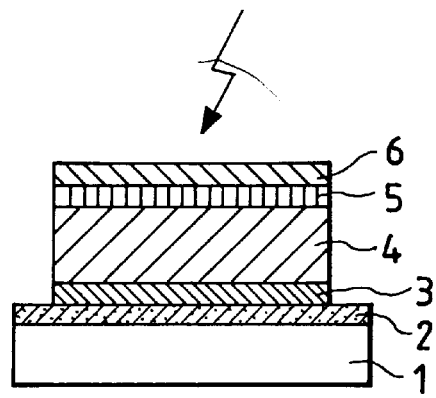
Figure 1B:
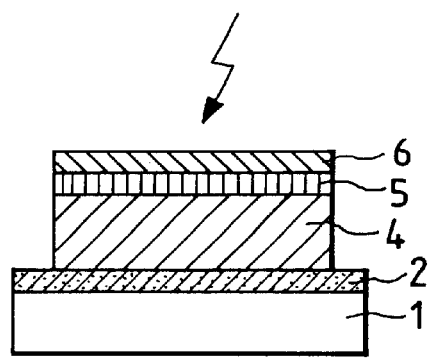
Figure 1C:
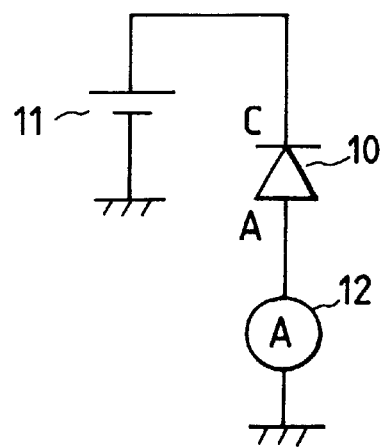
FIG. 1C is an equivalent circuit diagram showing a schematic drive circuit for the photoelectric converting element shown in FIG. 1A or 1B.

FIGS. 1A to 1C are views showing the configuration of the photosensor, wherein FIGS. 1A and 1B show layer structures of two kinds of photosensor while FIG. 1C shows a representative driving method common to two kinds. FIGS. 1A and 1B both show photosensors of photodiode type, respectively called PIN type and Shottky type, wherein shown are a substrate 1 which is insulating at least at the surface thereof; a lower electrode 2; a p-type semiconductor layer 3 (hereinafter called p-layer); an intrinsic semiconductor layer 4 (hereinafter called i-layer); an n-type semiconductor layer 5 (hereinafter called n-layer); and a transparent electrode 6. In the Shottky type structure, the material of the lower electrode 2 is suitably selected to form a Shottky barrier layer for inhibiting electron injection from the lower electrode 2 to the i-layer 4. In FIG. 1C, there are shown a photosensor 10 represented as a symbol; a power source 11 and a detecting unit 12 such as a current amplifier. In the photosensor 10, C indicates the side of the transparent electrode 6 shown in FIGS. 1A and 1B, while A indicates the side of the lower electrode 2, and the power source 11 is so arranged as to apply a positive voltage to the side A with respect to the side C.

Now the function of the photosensor will be briefly explained. As shown in FIGS. 1A and 1B, when the light enters from a direction indicated by an arrow and reaches the i-layer 4, it is absorbed to generate an electron and a hole. Since an electric field is applied to the i-layer 4 by the power source 11, the electron moves toward the side C, through the n-layer 5 to the transparent electrode 6, while the hole moves toward the side A, or to the lower electrode 2. In this manner a photocurrent is generated in the photosensor 10. In the absence of the light entry, the i-layer 4 does not generate electron or a hole. Also the n-layer 5 functions as a hole injection inhibiting layer for the holes in the transparent electrode 6, while the p-layer 3 in the PIN type shown in FIG. 1A or the Shottky barrier layer in the Shottky type shown in FIG. 1B functions as an electron injection inhibiting layer for the electrons in the lower electrode 2, so that no current is generated. Consequently the presence or absence of incident light causes a variation in the current, and a photosensor can be obtained by detecting such variation by the detecting unit 12 shown in FIG. 1C.

However it is not easy to construct a photoelectric conversion device of a sufficiently high S/N ratio and a low cost with the photosensors of the above-explained configurations, because of the following reasons. The first reason is the necessity of injection inhibiting layers in two positions, but in the PIN type shown in FIG. 1A and in the Shottky type in FIG. 1B. In the PIN type shown in FIG. 1A, the n-layer 5 constituting the injection inhibiting layer is required to have the properties of guiding the electrons to the transparent electrode 6 and inhibiting the injection of the holes into the i-layer 4. If either of these properties is not satisfied, there will result a decrease in the S/N ratio because the photocurrent decreases or because the current in the absence of the incident light (hereinafter called "dark current") is generated or increases. Such dark current is itself considered as a noise and also contains therein a fluctuation, called shot noise or so-called quantum noise, and the quantum noise involved in the dark current cannot be made smaller even by the subtraction of the dark current in the detection unit 12. For improving these properties, it is usually necessary to optimize the film forming conditions for the i-layer 4 and the n-layer 5 or the annealing condition after the film formation. However, also the p-layer 3 constituting the other injection inhibiting layer is required to have properties similar to the foregoing but inversely applicable to the electrons and the holes. Usually the condition for optimizing the n-layer is not same as that for optimizing the p-layer, and it is not easy to satisfy both conditions at the same time. Stated differently, the formation of the photosensor of a high S/N ratio becomes difficult because of the necessity of two injection inhibiting layers of mutually opposed properties within a same photosensor. This applies also to the Shottky type photosensor shown in FIG. 1B. Also such Shottky type photosensor shown in FIG. 1B employs, in one of the injection inhibiting layers, a Shottky barrier layer, relying on the difference in the work functions of the lower electrode 2 and the i-layer 4, whereby the material of the lower electrode 2 is limited or the characteristics are significantly influenced by the presence of the localized level at the interface. It is therefore not easy to ideally satisfy all these conditions. It is also proposed, for improving the property of the Shottky barrier layer, to form a silicon film or a metal oxide or nitride film of a small thickness in the order of 100 Å between the lower electrode 2 and the i-layer 4, for improving the effects of guiding the holes to the lower electrode 2 and inhibiting the injection of the electrons into the i-layer 4 by the tunneling effect. Such configuration also utilizes the difference of the work functions and inevitably involves the limitation on the material of the lower electrode 2. Also in order to achieve mutually opposite properties, namely the inhibition of injection of the electrons and the promotion of movement of the holes by the tunneling effect, the thickness of such oxide or nitride film is limited to a very small value, in the order of 100 Å, and it is not easy to achieve a high productivity because of the difficult in the control of thickness or film quality.

Also the necessity for the injection inhibiting layers in two positions lowers the productivity, thus giving rise to an increased cost, because the performance as the photosensor cannot be obtained if a defect is generated, for example by particles, even in one of the two injection inhibiting layers, which play important role in the performance.

Figure 2:
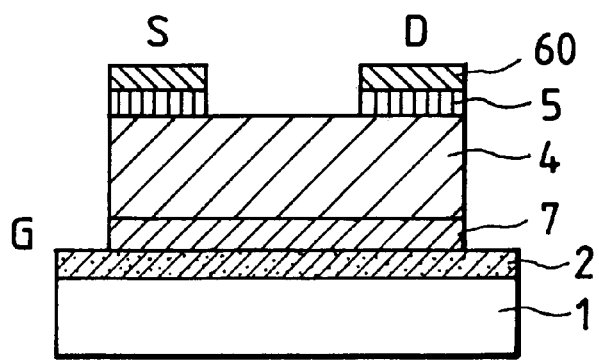
FIG. 2 is a schematic cross-sectional view of a TFT (thin film transistor)

Such second reason will be explained with reference to FIG. 2, which shows the layered configuration of a field effect transistor consisting of thin semiconductor films (TFT). Such TFT is often utilized as a part of the control unit in the photoelectric conversion device. In FIG. 2, components same as those in FIGS. 1A to 1C are represented by same numbers. In FIG. 2 there are also shown is a gate insulation film 7, and an upper electrode 60. Such TFT is prepared in the following manner. On an insulating substrate 1, there are formed in succession a lower electrode 2 functioning as a gate electrode (G), a gate insulation film 7, an i-layer 4, an n-layer 5, and an upper electrode 60 functioning as source and drain electrodes (S, D). Then the upper electrode 60 is etched to form the source and drain electrodes, and then the n-layer 5 is etched to form a channel portion. As the characteristics of the TFT are sensitive to the state of the interface between the gate insulation film 7 and the i-layer 4, these films are normally deposited in succession under a same vacuum condition, in order to avoid contamination of these films.

In case a photosensor is formed also on the substrate of the TFT, the above-explained layer structure becomes the cause of increased cost or deteriorated characteristics. More specifically, the photosensor has a layer structure, in the order from the substrate side, of electrode/p-layer/i-layer/n-layer/electrode in case of the PIN type shown in FIG. 1A or electrode/i-layer/n-layer/electrode in case of the Shottky type shown in FIG. 1B, while the TFT has a layer structure, in the order from the substrate side, of electrode/insulation film/i-layer/n-layer/electrode, and these structures cannot be prepared in a same process sequence without causing a loss in the production yield or an increase in cost because of the complication of the process. Also the formation of i-layer/ n-layer at the same time in a common process requires an etching step for the gate insulation film 7 and the p-layer 3, and, in such case, these results possibility that the injection inhibiting p-layer 3, important in the performance of the photosensor, and the i-layer 4 cannot be formed in succession under a same vacuum condition or that the interface between the gate insulation film 7, important in the TFT, and the i-layer 4 is contaminated by etching operation for patterning the gate insulation film, eventually leading to a deterioration in the characteristics and in the S/N ratio.

Figure 3:
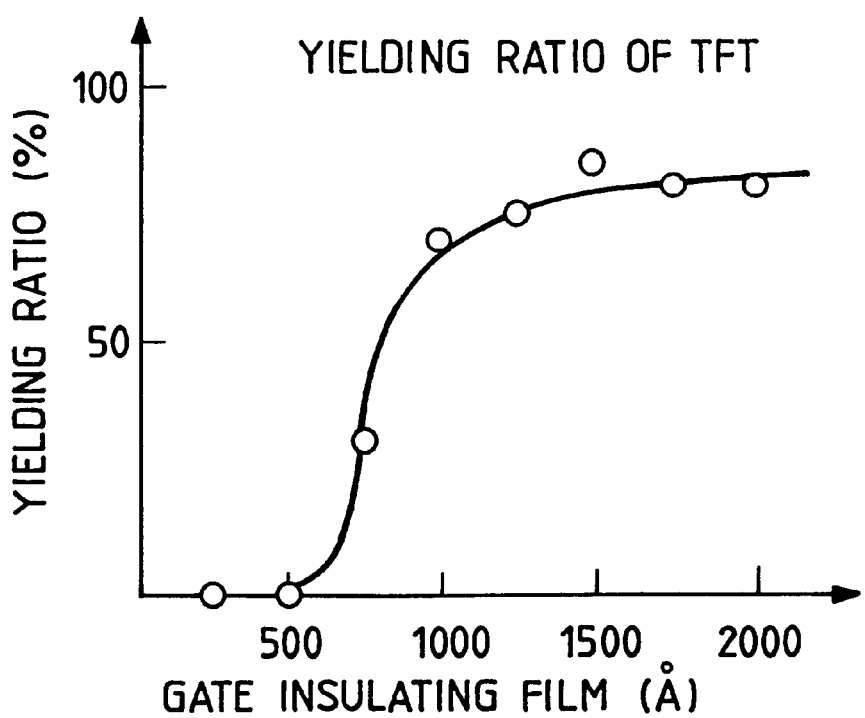
FIG. 3 is a chart showing an example of the relationship between the thickness of the gate insulation film of TFT and the yield.

The layered configuration can be made same in case an oxide or nitride film is formed between the lower electrode 2 and the i-layer 4 for improving the characteristics of the Shottky type photosensor shown in FIG. 1B. However such oxide or nitride film is required to have a thickness in the order of 100 Å and cannot therefore be used in common with the gate insulation film. FIG. 3 shows an experimental result of the present inventors on the relationship between the thickness of the gate insulation film and the production yield of the TFT. The production yield became drastically lower when the thickness of the gate insulation film was reduced from 1000 Å, and was reduced to about 30% and 0% respectively at thicknesses of 800 Å and 500 Å, and even the function of TFT could not be observed at a thickness of 250 Å. These data indicate that the oxide or nitride film for the photosensor utilizing the tunneling effect cannot be used as the gate insulation film, which has to perform insulation for the electrons or the holes, in the TFT.

It is also difficult to prepare a capacitance element (hereinafter called "capacitor"), which is unrepresented but required for obtaining an integrated value of the charge or the current, with a satisfactory performance of a low leakage, in the configuration same as that of the photosensor. This is because, while the capacitor always requires a layer for inhibiting the movement of electrons and holes as an intermediate layer for two electrodes in order to accumulate a charge therebetween, it is difficult to obtain such intermediate layer of satisfactory performance with low thermal leakage as the photosensor only contains semiconductor layers or layers allowing the movement of electrons or holes between the electrodes.

Such lack of matching in process or in performance with the TFT or the capacitor which is an important element in the structure of the photoelectric conversion device renders it difficult to improve the production yield in constructing a system containing a two-dimensional array of a plurality of photosensors and designed to detect the signals thereof in succession, because of the large number and complexity of the process steps, and is considered a significant drawback in realizing a high-performance device of multiple functions with a low cost.

In the following there will be explained a prior photoelectric conversion device provided with a photosensor proposed to resolve the above-mentioned difficulties.

Figure 4:
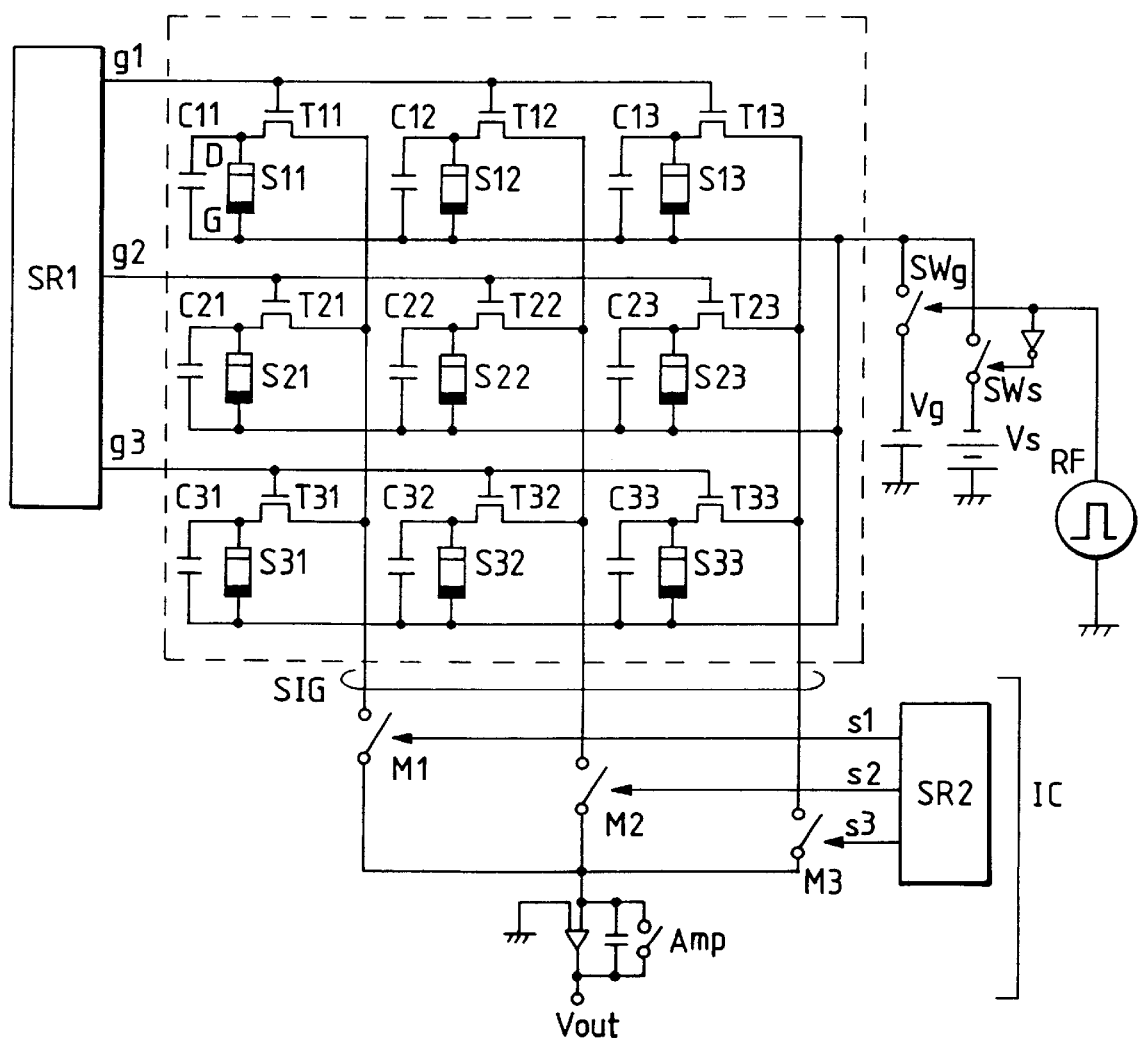
FIG. 4 is a schematic circuit diagram of a photoelectric conversion device having a two-dimensional array of photoelectric converting elements.
Figure 5A:
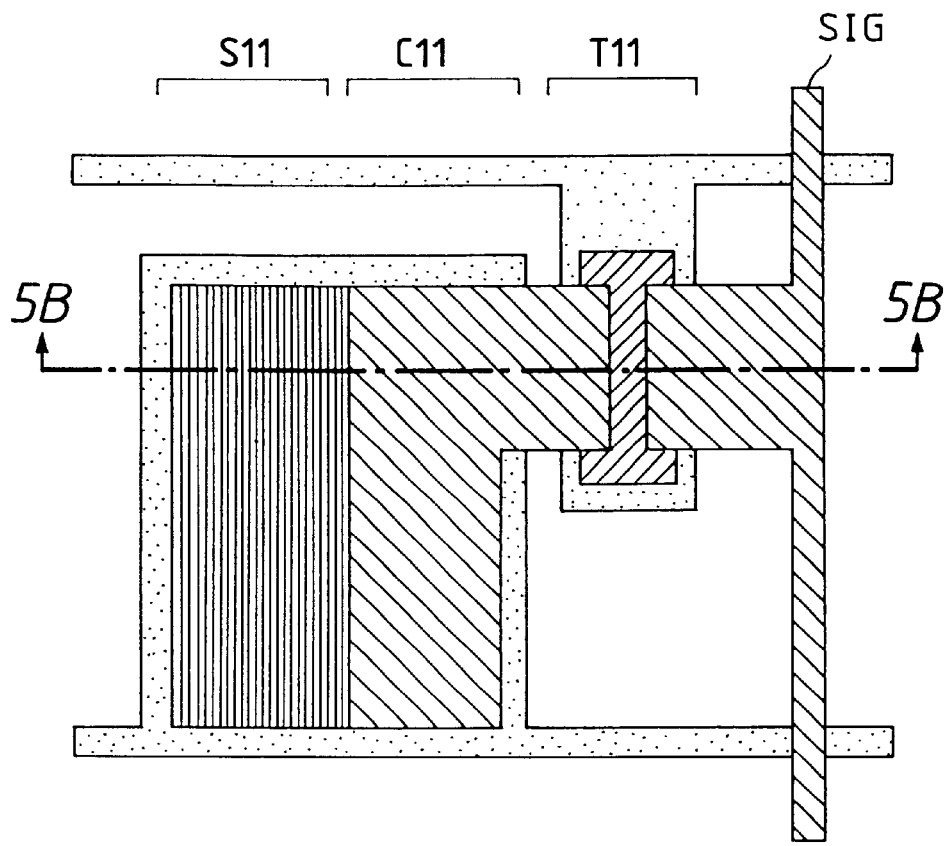
Figure 5B:
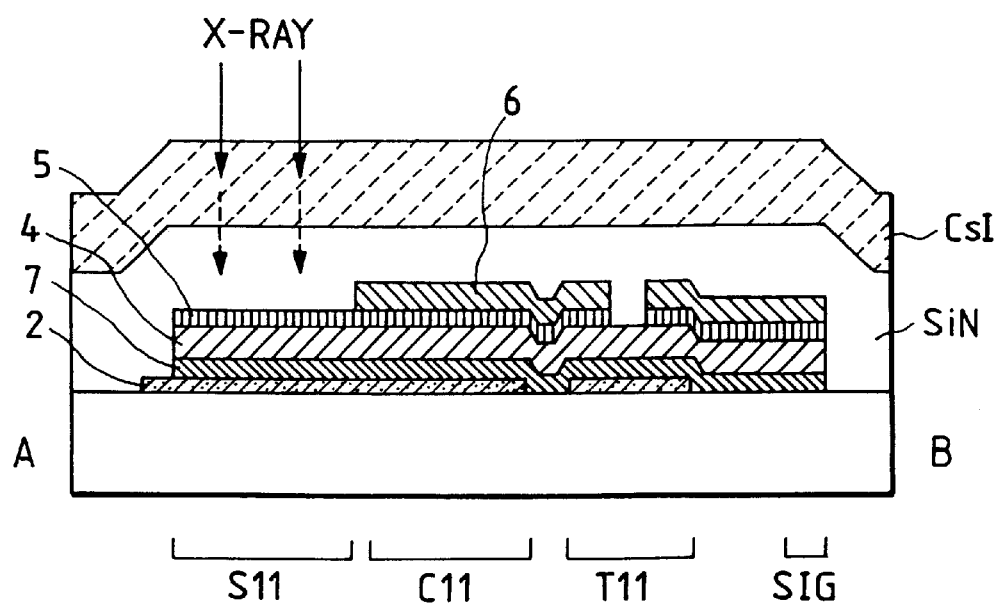
FIG. 5B is a schematic cross-sectional view of the pixel shown in FIG. 5A.

FIG. 4 is an entire circuit diagram of a prior example of the photoelectric conversion device, FIG. 5A is a schematic plan view of an example of a component element corresponding to a pixel of the photoelectric conversion device, and FIG. 5B is a schematic cross-sectional view along a line 5B—5B in FIG. 5A. In FIG. 4, there are shown photoelectric converting elements S11–S33 in which the lower electrode side and the upper electrode side are respectively indicated by G and D; accumulating capacitors C11–C33; transfer TFT's T11–T33; a reading power source Vs and a refreshing power source Vg connected, respective through switches SWs, SWg, to the G electrodes of al the photoelectric converting elements S11–S33. The switch SWs is connected through an inverter to a refreshing control circuit high frequency, while the switch SWg is connected directly thereto, and these switches are so controlled that the switch SWg is turned on during the refreshing period. A pixel is composed of a photoelectric converting element, a capacitor and a TFT, and the output signal therefrom is supplied, through a signal line SIG to a detecting integrated circuit IC. In such photoelectric conversion device, nine pixels are divided into three blocks, and the outputs of three pixels in each block are simultaneously transferred to the signal line SIG to the detecting integrated circuit IC and are converted thereinto into successive outputs (Vout). The three pixels in each block are arranged horizontally while the three blocks are arranged vertically to obtain a two-dimensional array of the pixels.

In FIG. 4, an area surrounded by a broken-lined frame is formed on a same insulating substrate of a large area, and a portion thereof corresponding to a first pixel is shown in a schematic plan view in FIG. 5A. Also FIG. 5B is a schematic cross-sectional view corresponding to a line 5B—5B. In these drawings there are shown a photoelectric converting element S11, a TFT T11, a capacitor C11, and a signal line SIG. In such prior photoelectric conversion device, proposed by the present inventor before, the capacitor C11 and the photoelectric converting element S11 are not particularly isolated but the electrodes of the photoelectric converting element S11 are made larger to constitute the capacitor C11. Such configuration is enabled by a fact that the photoelectric converting element and the capacitor have a same layer structure and features such prior proposed photoelectric conversion device. On the pixel there are formed a passivation silicon nitride film SiN and a fluorescent member CsI composed for example of cesium fluoride. The X-ray entering from above is converted by the fluorescent member CsI into light (represented by broken-lined arrows), which enters the photoelectric converting element.

In the following there will be explained the function of the above-explained photoelectric converting device with reference to FIG. 4 and FIG. 6, which is a timing chart showing an example of the function of the circuit shown in FIG. 4.

At first a Hi-level signal is applied, by shift registers SR1, SR2, to control lines g1–g3, s1–s3, whereby the transfer TFT's T11–T33 and switches M1–M3 are turned on and rendered conductive to shift the D electrodes of all the photoelectric converting elements S11–S33 to the ground potential as the input terminal of an integrating detector Amp is designed at the ground potential. At the same time the refresh control circuit high frequency releases a Hi-level signal to turn on the switch SWg, whereby the G electrodes of all the photoelectric converting elements S11–S33 are shifted to a positive potential by the refreshing power source Vg and all the photoelectric converting elements S11–S33 assume the refreshing mode and are refreshed. Then the refresh control circuit high frequency releases an Lo-level signal to turn on the switch SWs, whereby the G electrodes of all the photoelectric converting elements S11–S33 are shifted to a negative potential by the reading power source Vs. Thus all the photoelectric converting elements S11–S33 assume the photoelectric conversion mode, and the capacitors C11–C33 are initialized at the same time. In this state the shift registers SR1, SR2 send Lo-level signals to the control lines g1–g3, s1–s3 to turn off switches M1–M3 of the transfer TFT's T11–T33, whereby the D electrodes of all the photoelectric converting elements S11–S33 are left open in DC manner but are retained at a certain potential by the capacitors C11–C33. At this point, however, the photoelectric converting elements S11–S33 do not receive light and does not generate photocurrents, because of absence of entry of the X-ray. Then, the X-ray is emitted in pulsed manner, transmitted for example by a human body and enters the fluorescent member CsI for conversion into light, which enters the respective photoelectric converting elements S11–S33. Such incident light contains information on the internal structure for example of the human body. The photocurrents generated by the incident light are accumulated in the capacitors C11–C33, in a form of charges, which are retained even after the X-ray irradiation is terminated. Then the shift register SR1 applies a Hi-level control pulse to the control line g1 while the shift register SR2 applies to the control pulses to the control lines s1–s3 whereby output signals v1–v3 are released in succession through the switches M1–M3 of the transfer TFT's T11–T33. Also other signals are released in succession by similar control of the shift registers SR1, SR2, whereby the two-dimensional information of the internal structure of the human body is obtained as v1–v9. A still image is obtained by the process explained in the foregoing, but such process is repeated to obtain a moving image.

In the above-explained photoelectric conversion device, the G electrodes of the photoelectric converting elements are connected in common and are controlled at the potential of the refreshing power source Vg or of the reading power source Vs through the switches SWg and SWs, so that all the photoelectric converting elements can be simultaneously switched to the refreshing mode or the photoelectric conversion mode. It is thus rendered possible to obtain a light output signal, by a TFT per pixel, without complex control.

In the above-explained photoelectric conversion device, nine pixels are two-dimensionally arranged in a 3×3 matrix and are transferred and outputted in three divided operations. Such configuration can be expanded, for example, to a two-dimensional array of 2000×2000 pixels, arranged with a density of 5×5 pixels per square millimeter to obtain an X-ray detector of 40×40 cm. Such X-ray detector can be combined, in place for an X-ray film, with an X-ray generator to form an X-ray image capture apparatus that can be used for chest radiological inspection, mammographic inspection or non-destructive testing. In contrast to the conventional X-ray film, such apparatus allows to instantaneously display the output image on an output device such as a CRT, and also to convert the output signals into digital form and to effect suitable image processing on a computer. Also such image can be stored on a magnetooptical disk and the images taken in the past can be retrieved instantaneously. Also such apparatus has a sensitivity superior to that of the X-ray film and can be obtain a clear image with a weak X-ray having less detrimental effect on the human body.

Figure 7:
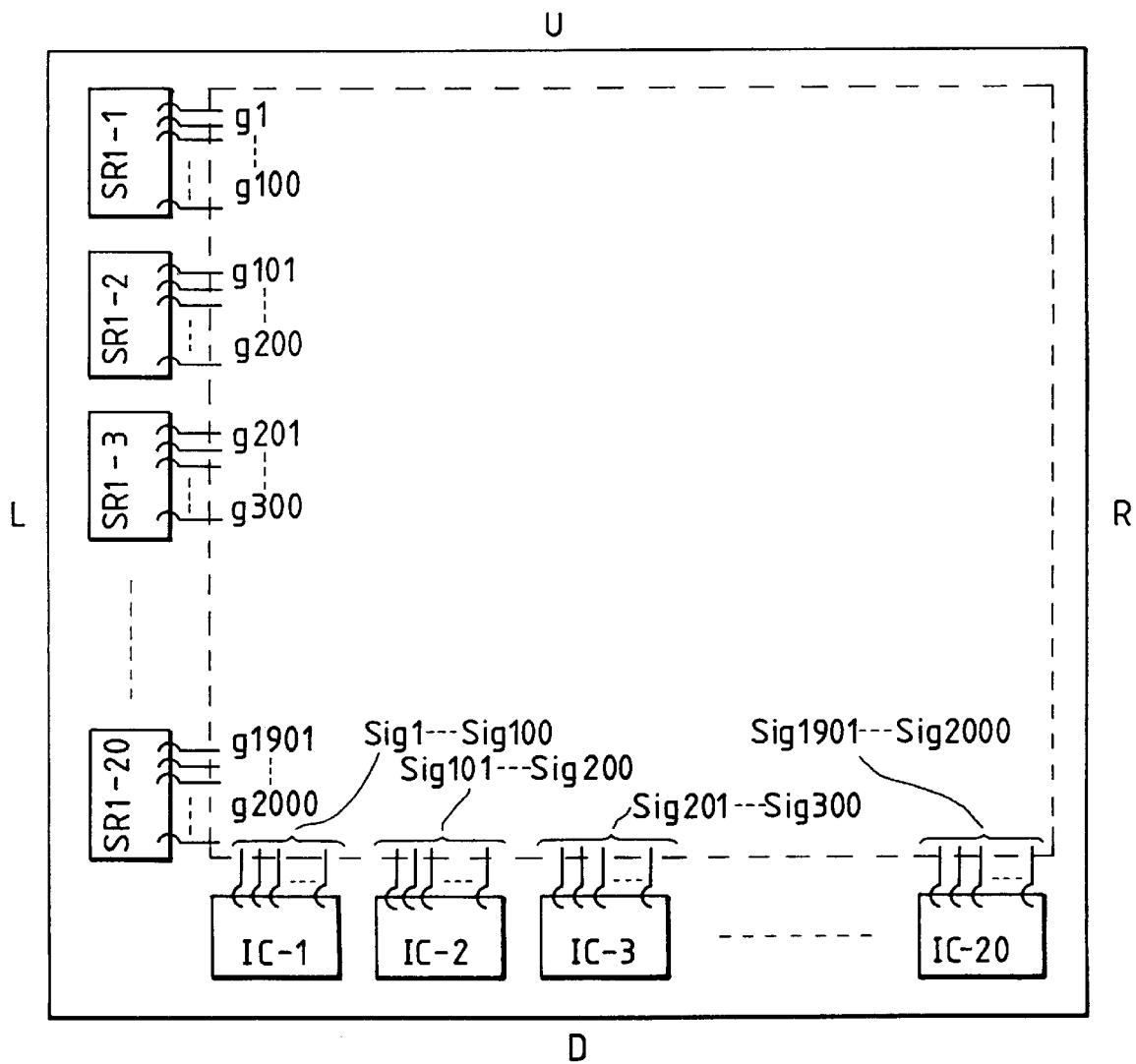
FIGS. 7 and 8 are schematic plan views showing examples of the arrangement of reading areas and driving IC's.
Figure 8:
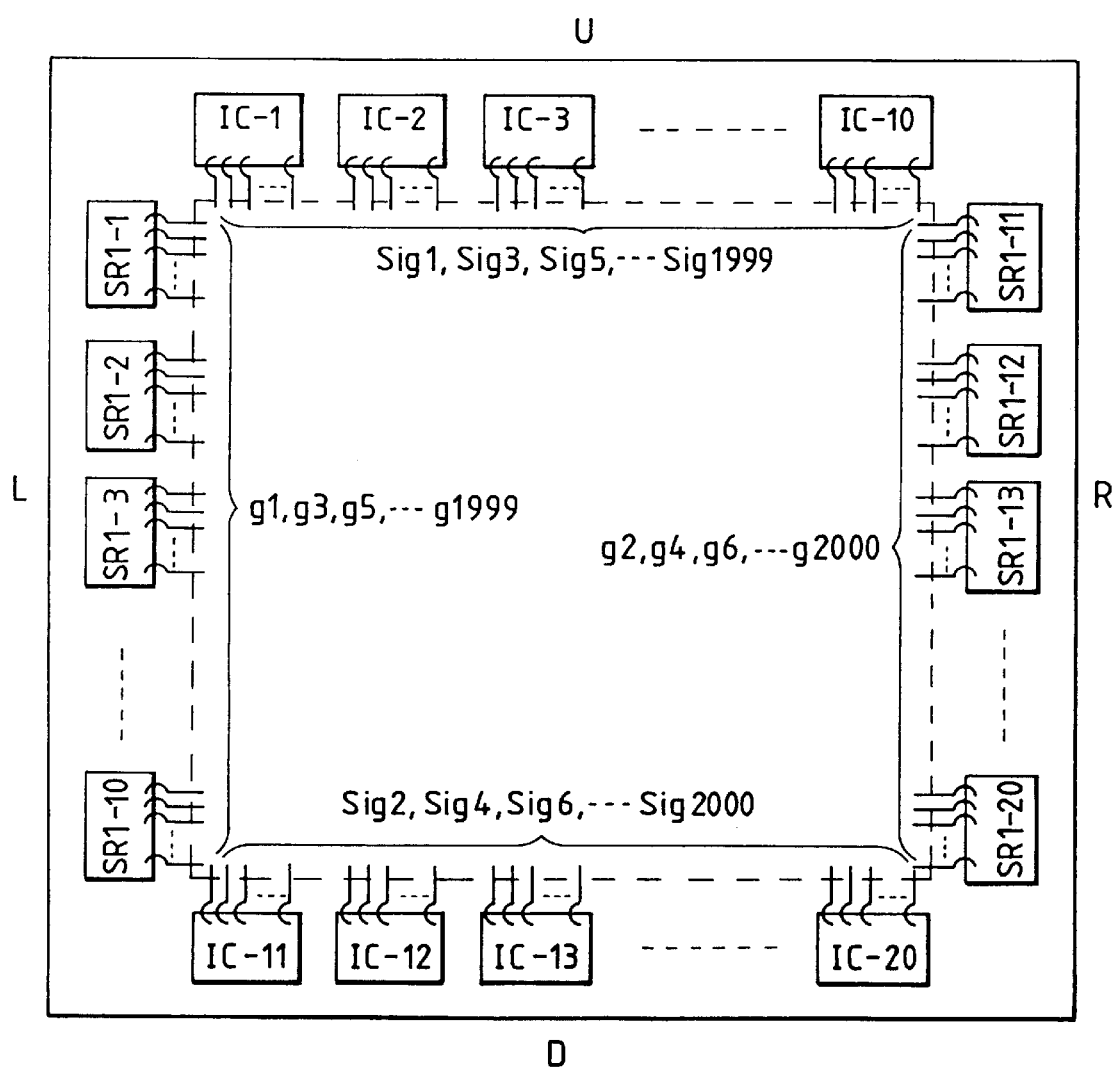

FIGS. 7 and 8 show an example of the photoelectric conversion device having 2000×2000 pixels. Such detector with 2000×2000 pixels can be obtained by increasing the number of the elements, in the broken-lined frame shown in FIG. 4, in the vertical and horizontal directions. In such case, there will be required 2000 control lines g1–g2000 and 2000 signal lines sig1–sig2000. Also the shift register SR1 or the detecting integrated circuit IC becomes large in scale as it has to control or process 2000 lines. Such device, if formed as a single chip, becomes extremely large and is disadvantageous in the projection yield or in the cost. Therefore the shift register SR1 is constituted by 20 chips SR1-1–SR1-20, each covering 100 lines. Also the detecting integrated circuit is constituted by 20 chips IC1–IC20, each covering 100 processing circuits.

In the configuration shown in FIG. 7, 20 chips (SR1-1–SR1-20) are mounted at the left side (L) while 20 chips are mounted at the lower side (D), and 100 control or signal lines are connected by wire bonding to each chip. In FIG. 7, a broken-lined frame area corresponds to that in FIG. 4. Omitted from the illustration are the connections to the exterior and other components such as SWg, SWs, Vg, Vs, RF etc. The detecting integrated circuits IC1–IC20 have 20 outputs (Vout) which may be combined into one for example through a switch or may be released to the exterior in parallel manner.

FIG. 8 shows another configuration, having 10 chips SR1-1–SR1-10 at the left side (L), 10 chips SR1-11–SR1-20 at the right side (R), 10 chips IC1–IC10 at the upper side (U) and 10 chips IC11–IC20 at the lower side (D). This configuration can improve the production yield, since the lines are equally divided by 1000 lines to each of the upper, lower, left and right sides whereby the density of the lines or of the wire bonding on each side can be reduced. The division of the lines is made in such a manner that the odd-numbered control lines g1, g3, g5, . . . , g1999 are extracted to the left side L while the even-numbered control lines are extracted to the right side R, whereby the lines can be extracted at a constant pitch, without concentration in density. The lines to the upper side and to the lower side can also be divided in a similar manner.

In another unillustrated arrangement, the control lines are divided in groups of lines which are continuous for each chip, namely g1–g100, g201–g300, . . . , g1801–g1900 at the left side L and g101–g200, g301–g400, . . . , g1901–g2000 at the right side R, alternately to the left and right sides. Such arrangement allows continuous control with simpler control of drive timing within each chip, which can be made less expensive because of the simpler circuit configuration. A similar arrangement can be adopted also in the upper and lower sides to enable continuous processing, thereby allowing the use of inexpensive circuits.

The configuration shown in FIG. 7 or 8 can be obtained by forming the circuits of the broken-lined frame area on a large substrate and then mounting the chips on such substrate, or by mounting a substrate bearing the circuits of the broken-lined frame area and the chips on another large substrate. It is also possible to mount the chips on a flexible substrate and to adhere and connect it to a substrate bearing the circuits of the broken-lined frame area.

Such large-area photoelectric conversion device with a large number of pixels can be obtained with a high production yield and a low cost, by forming the different elements simultaneously with common films, thus with a simpler process with a reduced number of process steps. Also the capacitor the TFT and the photoelectric converting element can be formed within a same pixel, whereby the number of the elements can be reduced almost to a half and the production yield can thus be improved further.

In the above-explained configuration, the photoelectric converting element employed therein can detect the amount of the incident light with only one injection inhibiting layer and enables easy optimization of the production process, improvement in the production yield and reduction in the production cost, thus providing a photoelectric conversion device of a high S/N ratio and a low cost. Also as its layered configuration of first electrode layer/insulation layer/ photoelectric converting semiconductor layer in succession on the substrate does not utilize the tunneling effect or the Shottky barrier, the materials constituting the electrodes can be arbitrarily selected, and a larger freedom is secured for the thickness of the insulation layer and other controls.

Also such photoelectric converting element materials well with the switching element such as thin-film field effect transistor (TFT) and/or the capacitance element to be formed at the same time. These elements, having a same layered configuration, can be simultaneously formed by common films, and the films important for the photoelectric converting element and the TFT can be simultaneously formed under a same vacuum condition. Also the photoelectric converting element can be obtained with a high S/N ratio and a lower cost. Furthermore the capacitor, containing an insulation layer in the intermediate layer, can be provided with satisfactory performance. Thus there can be provided a photoelectric conversion device of a high performance, capable of outputting the integrated values of the optical information obtained with the plural photoelectric converting elements with a simple configuration. Also there can be provided a facsimile device or an X-ray image capture device of a large area with high performance and a low cost.

In any photoelectric conversion device having a two-dimensional array of a plurality of photosensors (photoelectric converting elemehts), it is important to obtain the necessary information at a higher speed.

A method for meeting such requirement, in a photoelectric conversion device for reading the signals in succession from a two-dimensional array of plural photoelectric converting elements on a substrate, by successively scanning plural drive lines in the X-direction thereby transferring the signal charges in the signal lines of the Y-direction, consists of successively scanning only arbitrarily selected drive lines of the above-mentioned photoelectric converting elements and simultaneously driving the remaining drive lines at a timing different from that for the above-mentioned arbitrarily selected drive lines, thereby transferring the signal lines.

Such method allows to eliminate the time required for driving the unnecessary drive lines and for reading the unnecessary output signals by simultaneously driving the unnecessary drive lines instead of successive drive, whereby the signals of the necessary area can be read at a higher speed. Thus, in case the photoelectric conversion device is utilized as an X-ray image capture device, particularly in case of observation of a moving image by continuous irradiation of such image capture device with X-ray, there can be achieved a reduction in the X-ray radiation dose, providing a significant advantage in medical and environmental sense.

Also the sensor characteristics of all the photoelectric converting elements can be equalized by simultaneously returning the potentials at both ends of unnecessary photoelectric converting elements to the initial value within a short time, whereby provided is a photoelectric conversion device with a high reliability in the obtained information.

Another method for meeting the aforementioned requirement, in a photoelectric conversion device for reading the signals in succession from a two-dimensional array of plural photoelectric converting elements on a substrate, by successively scanning plural drive lines in the X-direction thereby transferring the signal charges in the signal lines of the Y-direction, consists of successively scanning in succession the arbitrarily selected necessary drive lines only, and not effecting the drive of the remaining drive lines for the transfer of the signal charges.

Also in such case, the time required for driving the unnecessary drive lines and for reading the unnecessary output signals can be eliminated, so that the signals of the necessary area can be read at a higher speed. Thus, as explained in the foregoing, in case the photoelectric conversion device is utilized as an X-ray image capture device, particularly in case of observation of a moving image by continuous irradiation of such image capture device with X-ray, there can be achieved a reduction in the X-ray radiation dose, providing a significant advantage in medical and environmental sense.

In the X-ray image capture device, an X-ray beam emitted from an X-ray source is directed to an object (specimen) to be analyzed, such as a medical patient. There is also known a method, after the X-ray passes through the specimen, of converting the X-ray image into a visible optical image by an image intensifier, then preparing an analog video signal from the visible optical image by a video camera and displaying such analog video signal on a monitor. In such case, since an analog video signal is prepared, the image processing for automatic luminance control and image emphasis is conducted in the analog form.

On the other hand, in the above-explained solid-state X-ray detector utilizes a two-dimensional array containing 3000 to 4000 detecting elements, such as photodiodes, in each line (such array being hereinafter called "detecting element array" or "detector array"). Each detecting element prepares an electrical signal corresponding to the pixel luminance of the X-ray image projected onto the detector, and the signals from the detecting elements are individually read and digitized, and are used for image processing, storage and display.

In such solid-state detecting element array, the bias charges set in the detecting elements may be partially discharged by the current leakage in the transistors or by a phenomenon generally called "dark current". Such charge depletion resulting from such dark current or leaking current induces an offset in the image signals. Since the amount of charges eliminated by such currents is not constant, the offset in the signals fluctuates, thus adding an uncertain factor to the outputs of the detectors.

The amount of charges eliminated from the detecting elements by the above-mentioned currents is a function of the time from the bias resetting of the detecting elements to the detection of the charges in the detecting elements. Consequently, for minimizing the influence of these currents, it is desirable to minimize the time required for signal reading from the elements of the detecting element array. On the other hand, for reducing the electrical noises added from the circuitry to the signals of the detectors, it is desirable to reduce the frequency band width of the image signal processing circuit and to extend the signal reading period.

In the photodetector array of matrix shape, the signals of the detecting elements are read one-directionally from one of the two sides mutually opposed in the direction of rows or columns to the other.

In most cases, however, the observer is interested in the central area of the image capture area, so that it is desirable to obtain the highest image quality in such central area. Also in a photodetector array of high resolution, it is particularly desirable to improve the image capturing speed by capturing the image with the detecting elements of the above-mentioned interest area.

It is therefore preferable to enable the image data reading so as to reduce the deterioration in the image quality in the image portion in which the observer is most interested.

In reading the image data from a photoelectric conversion device including a matrix array of photosensor elements, a high image quality can be obtained in an interest area by a method comprising steps of:

a) determining, as an interest area of the user, an area of the photosensor elements defined by a desired range of rows and a desired range of columns in the photoelectric conversion device;

b) detecting the signals of the photosensor elements of at least a row, from the side of one of the mutually opposed edges, in the direction of row, of the interest area;

c) detecting the signals of the photosensor elements of at least a row, from the side of the other of the mutually opposed edges, in the direction of row, of the interest area; and d) alternately repeating the steps b) and c), except for the already detected rows, until the signals of the photosensor elements of the row at the central portion of the interest area are detected.

Also in reading the image data from a photoelectric conversion device including a photosensor array in matrix form, there can be obtained a high image quality in the interest area by a method comprising steps of:

a) determining, as an interest area of the user, an area of the photosensor elements defined by a desired range of rows and a desired range of columns in the photoelectric conversion device;

b) detecting signals of the photosensor elements of at least a row in a central portion of the interest area;

c) detecting signals of the photosensor elements of at least a row adjacent to one of the two sides of the already detected row;

d) detecting signals of the photosensor elements of at least a row adjacent to the other of the two sides of the already detected row; and e) alternately repeating the steps c) and d), except for the already detected rows, until the signals of the photosensor elements of the rows on the mutually opposed edges, in the direction of row, of the interest area are detected.

Also in driving a photoelectric conversion device which is provided with a matrix array of photosensor elements and in which signals from at least a part of the photosensor elements of each column are taken out from a common column output line through switching elements, the information of the interest area can be obtained without deterioration by another method comprising steps of:

a) determining, as an interest area of the user, an area of the photosensor elements defined by a desired range of rows and a desired range of columns in the photoelectric conversion device;

b) taking out the signals to the column output line by driving a switch element corresponding to the photosensor elements of at least a row, from the side of one of the mutually opposed edges, in the direction of row, of the interest area;

c) taking out the signals to the column output line by driving a switch element corresponding to the photosensor elements of at least a row, from the side of the other of the mutually opposed edges, in the direction of row, of the interest area; and d) alternately repeating the steps b) and c), except for the already detected rows, until the signals of the photosensor elements of the row at the central portion of the interest area are detected.

Also in driving a photoelectric conversion device which is provided with a matrix array of photosensor elements and in which signals from at least a part of the photosensor elements of each column are taken out from a common column output line through switching elements, the information of the interest area can be obtained with deterioration by another method comprising steps of:

a) determining, as an interest area of the user, an area of the photosensor elements defined by a desired range of rows and a desired range of columns in the photoelectric conversion device;

b) taking out the signals to the column output line by driving a switch element corresponding to the photosensor elements of at least a row at the central portion of the interest area;

c) taking out the signals to the column output line by driving a switch element corresponding to the photosensor elements of at least a row adjacent to one of the two sides of the already detected row;

d) taking out the signals to the column output line by driving a switch element corresponding to the photosensor elements of at least a row adjacent to the other of the sides of the already detected row; and e) alternately repeating the steps c) and d), except for the already detected rows, until the switch elements corresponding to the photosensor elements of the rows at the mutually opposed edges, in the direction of row, of the interest area are driven.

Also in a photoelectric conversion device provided with a matrix array of photosensor elements and including a signal charge accumulation unit corresponding to each photosensor element and a switch unit provided in the signal output path from such signal charge accumulation unit, satisfactory data reading in the interest area can be achieved by a photoelectric conversion device comprising:

interest area determination means for determining, as an interest area of the user, an area of the photosensor elements defined by a desired range of rows and a desired range of columns in the photoelectric conversion device, and drive means for generating a drive signal for the photoelectric conversion device based on the output of the interest area determination means;

wherein the drive means is adapted to generate the drive signal for the photodetector array in such a manner as to reset the charges of the signal charge accumulation units by driving the switch units of the photodetector array in succession from a row at the periphery of the interest area to a row at the center thereof, and, after the exposure to the light, to read the signal charges of the signal charge accumulation units by driving the switch units of the photodetector array in succession from the central portion of the interest area to the peripheral portion thereof.

The photoelectric conversion device may also be so constructed as to comprise read instruction detecting means for detecting a read instruction, and control means for controlling the aforementioned drive means based on the output of the read instruction detecting means, wherein the control means is adapted to control the drive means so as to effect the resetting, the exposure after the resetting and the signal charge reading after the exposure based on the output of the read instruction detecting means.

The photoelectric conversion device may further comprise wavelength conversion means for converting an X-ray, emitted from X-ray irradiation means, into a visible light, and adapted to detect the visible light, emitted from the conversion means, by the photodetector array.

The drive means may be so constructed as to generate drive signals for the photodetector array, for refreshing the signal charge accumulation units by driving the switch units of the photodetector array in succession from a row in the peripheral portion of the interest area to a row at the central portion thereof.

In the following the present invention will be clarified in detail by preferred embodiments thereof, with reference to the attached drawings.

[First embodiment]

Figure 9:
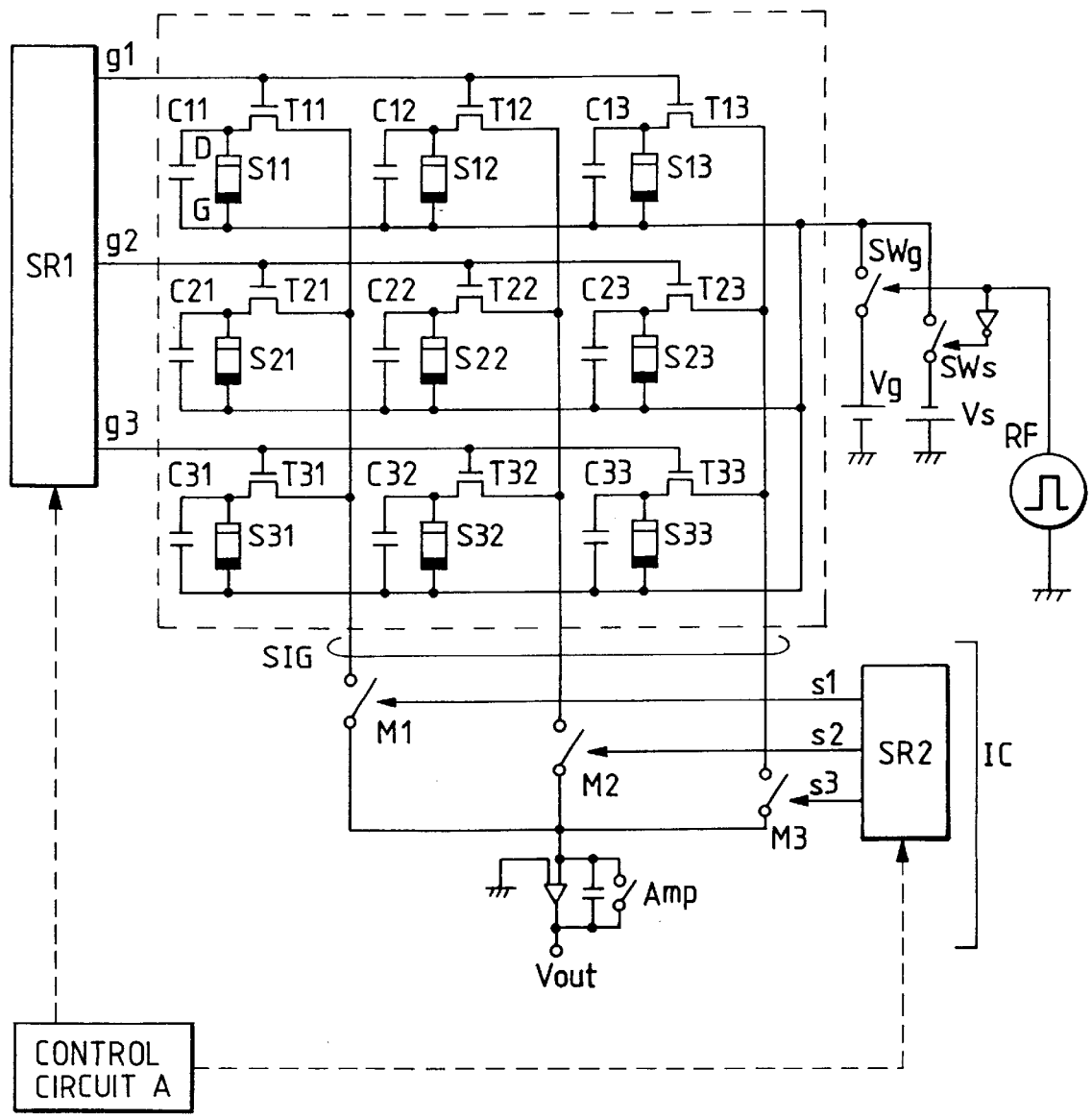
FIG. 9 is a schematic equivalent circuit diagram of an example of the photoelectric conversion device.
Figure 10:
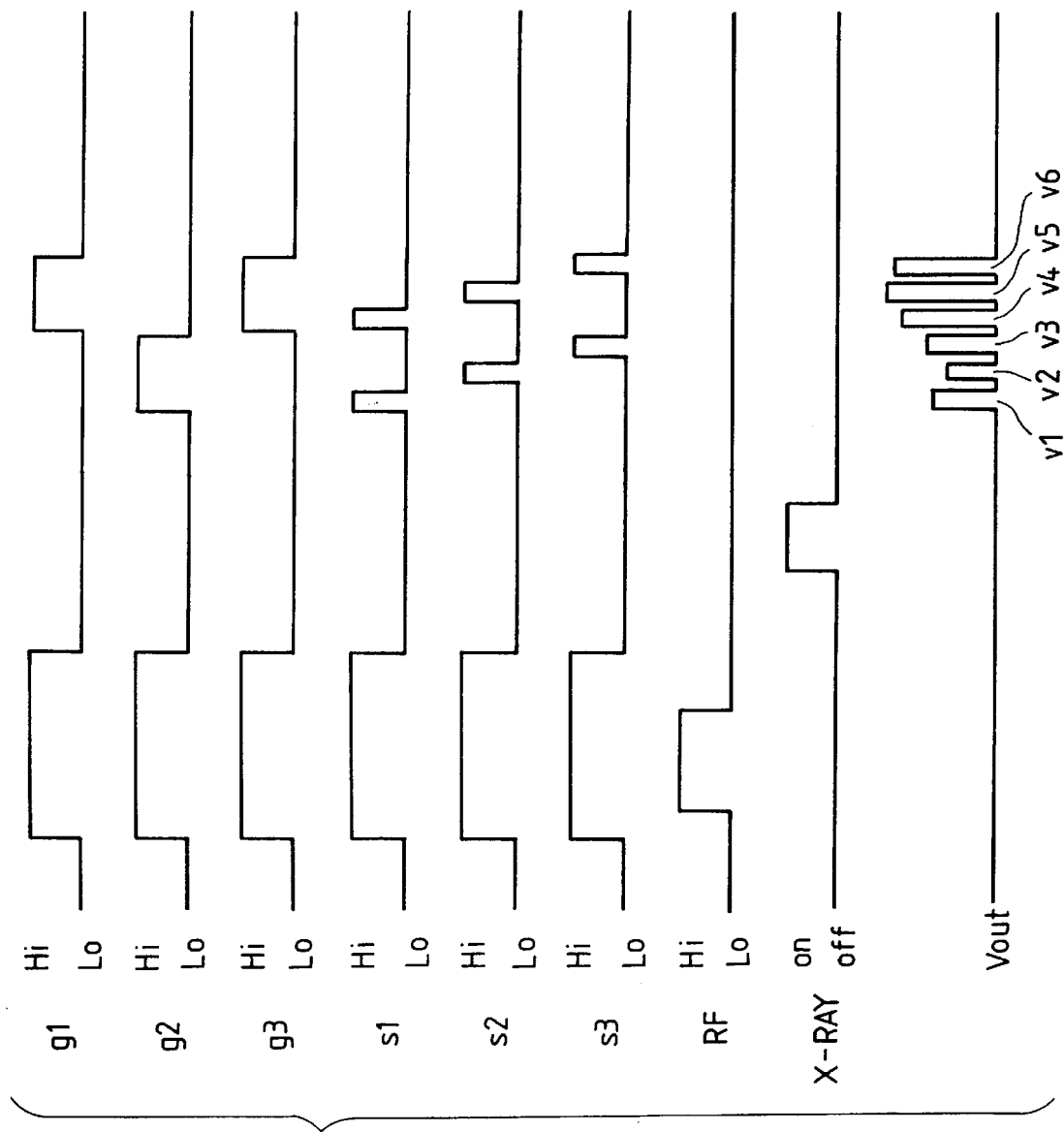
FIGS. 10 and 11 are timing charts showing examples of drive of the photoelectric conversion device shown in FIG. 9.

FIG. 9 is a schematic circuit diagram of a photoelectric conversion device constituting a first embodiment of the present invention, and FIG. 10 is a timing chart showing an example of the function thereof.

Now the function of the first embodiment will be explained with reference to FIGS. 9 and 10.

At first a Hi-level signal is applied, by the shift registers SR1, SR2, to the control lines g1–g3, s1–s3, whereby the transfer TFT's T11–T33 and the switches M1–M3 are turned on and rendered conductive to shift the D electrodes of all the photoelectric converting elements S11–S33 to the ground potential as the input terminal of the integrating detector Amp is designed at the ground potential.

At the same time the refresh control circuit high frequency releases a Hi-level signal to turn on the switch SWg, whereby the G electrodes of all the photoelectric converting elements S11–S33 are shifted to a positive potential by the refreshing power source Vg and all the photoelectric converting elements S11–S33 assume the refreshing mode and are refreshed.

Then the refresh control circuit high frequency releases a Lo-level signal to turn on the switch SWs, whereby the G electrodes of all the photoelectric converting elements S11–S33 are shifted to a negative potential by the reading power source Vs. Thus all the photoelectric converting elements S11–S33 assume the photoelectric conversion mode, and the capacitors C11–C33 are initialized at the same time. In this state the shift registers SR1, SR2 send Lo-level signals to the control lines g1–g3, s1–s3 to turn off the switches M1–M3 of the transfer TFT's T11–T33, whereby the D electrodes of all the photoelectric converting elements S11–S33 are left open in DC manner but are retained at a certain potential by the capacitors C11–C33.

At this point, however, the photoelectric converting elements S11–S33 do not receive light and does not generate photocurrents, because of absence of entry of the X-ray. Then the X-ray is emitted in pulsed manner, transmitted for example by a human body and enters the fluorescent member CsI for conversion into light, which enters the respective photoelectric converting elements S11–S33. Such incident light contains information on the internal structure for example of the human body. The photocurrents generated by the incident light are accumulated in the capacitors C11–C33, in a form of charges, which are retained even after the X-ray irradiation is terminated.

The function up to this point is same as that explained before. However the first embodiment is different in the driving method after this point, in case of a trimming drive in which the output signals are required only in a part of the photoelectric converting elements, instead of the signals of all the photoelectric converting elements S11–S33.

In the following there will be explained, as an example, a case of reading the output signals from the photoelectric converting elements S21, S22 and S23 only.

As shown in FIG. 9, a control circuit A for controlling the shift registers SR1, SR2 sends an instruction for the control lines related to the desired elements, namely the control lines g2 and s1–s3, whereby the shift register SR1 applies a Hi-level control pulse to the control line g2 while the shift register SR2 applies Hi-level control pulses to the control lines s1–s3 to release the signals s1–s3 in succession through the transfer TFT's T21–T23 and the switches M1–M3.

In this case, the control lines g1, g3 for transferring the unrequired output signals of the photoelectric converting elements S11–S13 and S31–S33 are given Hi-level control pulses at the same time, after the application of the Hi-level pulse to the control line g2. In this manner the unnecessary signal charges can be transferred to restore the initial state within a shorter time, in comparison with the driving method of applying the drive pulses in succession. More specifically, the potentials at both ends of the unnecessary photoelectric converting elements S11–S13 and S31–S33 are simultaneously returned to the initial value within a short time to equalize the sensor characteristics of all the photoelectric converting elements S11–S33. As a result, photoelectrically converted information of high reliability can always be obtained, regardless of the state of the non-reading pixels.

Subsequently the shift register SR2 applies control pulses to the control lines s1–s3 to release the signals v4–v6 through the switches M1–M3, but such output signals v4–v6 are not particularly required.

Thus the required two-dimensional information for example of the internal structure of the human body is obtained as v1–v3. A still image can be obtained by the process up to this point, but such process is repeated for obtaining a moving image.

For enabling such control, the present embodiment is provided with a control circuit A for controlling the shift registers SR1 and SR2 as shown in FIG. 9. More specifically, the control circuit A generates a signal capable of starting the shift register SR1 from an arbitrary address and stopping it at an arbitrarily designated address, and also generates start and stop signals for determining the addresses and the number of repetition of the register SR2 according to the number of driven addresses of the register SR1. In this manner the output signals can be obtained from the required photoelectric converting elements. Such control circuit, being capable of recognizing the entered bit numbers of the sensors, is composed of logic circuits, but it may also be composed of circuits utilizing a microcomputer.

In the present embodiment there has been explained a case of two-dimensionally arranging nine pixels into a 3×3 matrix and outputting the signals of only three pixels therein, but the trimming can be achieved by driving, by the shift registers, any plural desired drive lines in succession.

In the present embodiment, in a photoelectric conversion device for reading in succession the signals from plural photoelectric converting elements arranged in a two-dimensional array on a substrate, by successively scanning the drive lines in the X-direction thereby transferring the signal charges in the signal lines in the Y-direction, the arbitrarily selected necessary drive lines alone are scanned in succession while the remaining drive lines are not driven for the purpose of signal charge transfer. Such photoelectric conversion device, capable of dispensing with the time required for driving the unnecessary drive lines and for reading the unnecessary output signals, can read the necessary signals at a higher speed.

Thus, in case the photoelectric conversion device is utilized as an X-ray image capture device, particularly in case of observation of a moving image by continuous irradiation of such image capture device with X-ray, there can be achieved a reduction in the X-ray radiation dose, providing medically and environmentally significant advantage, because the above-explained drive method practically corresponds to an increase in the sensitivity of the sensors, as the eliminated drive time can also be used for the exposure.

Also the sensor characteristics of all the photoelectric converting elements can be equalized by simultaneously returning the potentials at both ends of unnecessary photoelectric converting elements to the initial value within a short time, whereby provided is a photoelectric conversion device with a high reliability.

The above-explained photoelectric converting element is provided, in the order from the substrate side, with a first electrode layer, a first insulation layer for inhibiting the movement of both the carriers of a first type and those of a second type different in polarity from the carriers of the first type, a non-singlcrystalline photoelectric converting semiconductor layer, a second electrode layer and an injection inhibiting layer positioned between the second electrode layer and the photoelectric converting semiconductor layer and adapted to inhibit the injection of the carriers of the first type into the photoelectric converting semiconductor layer.

Also there are provided a control unit, a power source unit and a detection unit for controlling the switch elements:

for applying an electric field to the above-mentioned layers of the photoelectric converting element, in the refreshing mode, in such a direction as to guide the carriers of the first type from the photoelectric converting semiconductor layer to the second electrode layer;

for applying an electric field to the above-mentioned layers of the photoelectric converting element, in the photoelectric conversion mode, in such a direction as to retain the carriers of the first type, generated by the light entering the photoelectric converting semiconductor layer, within the photoelectric converting semiconductor layer and to guide the carriers of the second type to the second electrode layer; and for detecting the carriers of the first type, accumulated in the photoelectric converting semiconductor layer in the photoelectric conversion mode, or the carriers of the second type guided to the second electrode layer, as the light signals.

The above-mentioned switching element is provided, in the order from the substrate side, with a gate electrode layer, a second insulation layer, a non-singlcrystalline semiconductor layer, a main electrode layer constituting a pair of first and second main electrodes separated by a portion of the above-mentioned semiconductor layer, constituting a channel area, and an ohmic contact layer positioned between the main electrode layer and the above-mentioned semiconductor layer.

At least a part of the photoelectric converting semiconductor layer and the semiconductor layer mentioned above is composed of hydrogenated amorphous silicon.

[Second embodiment]

Figure 6:
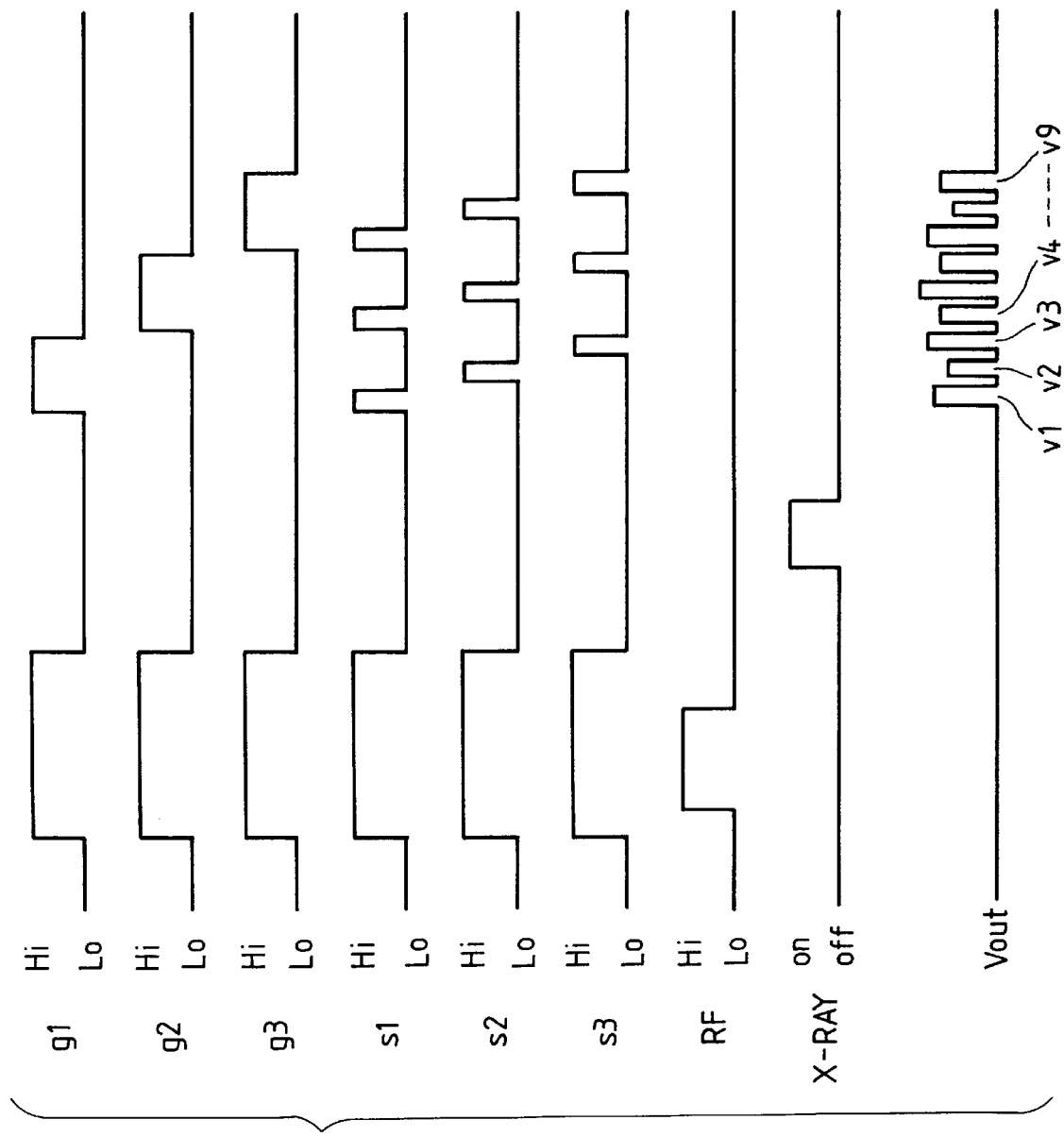
FIG. 6 is a timing chart showing an example of drive of the photoelectric conversion device shown in FIG. 4.

This embodiment provides a photoelectric conversion device having an equivalent circuit diagram shown in FIG. 9 and capable of switching the drive method with trimming according to the timing chart shown in FIG. 10 and the drive method for reading all the pixels according to FIG. 6.

Such photoelectric conversion device is convenient for use, as the reading of all the pixels and the partial reading can be arbitrarily selected according to the necessity.

For enabling such control, the present embodiment is provided, as in the first embodiment, with a control circuit A for controlling the shift registers SR1 and SR2. The partial reading and the reading of all the pixels can be switched by the entry, into the control circuit A, of the name of the required output signals in case of the trimmed reading, or of the name of the required output signals of all the pixels in case of the reading of all the pixels.

It is also possible to obtain high-definition moving image information in the interest area while reading the peripheral area, by alternately effecting or suitably switching the reading of all the pixels and the trimmed reading.

The information obtained outside the trimmed area may not provide satisfactory moving image, but the satisfactory image reading can be achieved easily and securely in the necessary interest area.

[Third embodiment] This embodiment provides, in the photoelectric conversion device shown in FIG. 9, another example of reading the output signals of the photoelectric converting elements S21, S22 and S23 only. The drive until the charge accumulation by photoelectric conversion is same as in the first embodiment. Also the photoelectric conversion device can be basically identical, in configuration with that of the first embodiment.

The accumulated charges are outputted in succession as signals v1–v3, through the transfer TFT's T21–T23 and the switches M1–M3, by the application of a Hi-level control pulse to the control line g2 and of control pulses to the control lines s1–s3 of the shift register SR2. Hi-level control pulses are not applied to the control lines g1, g3 for transferring the unnecessary output signals of the, photoelectric converting elements S11–S13 and S31–S33.

Figure 11:
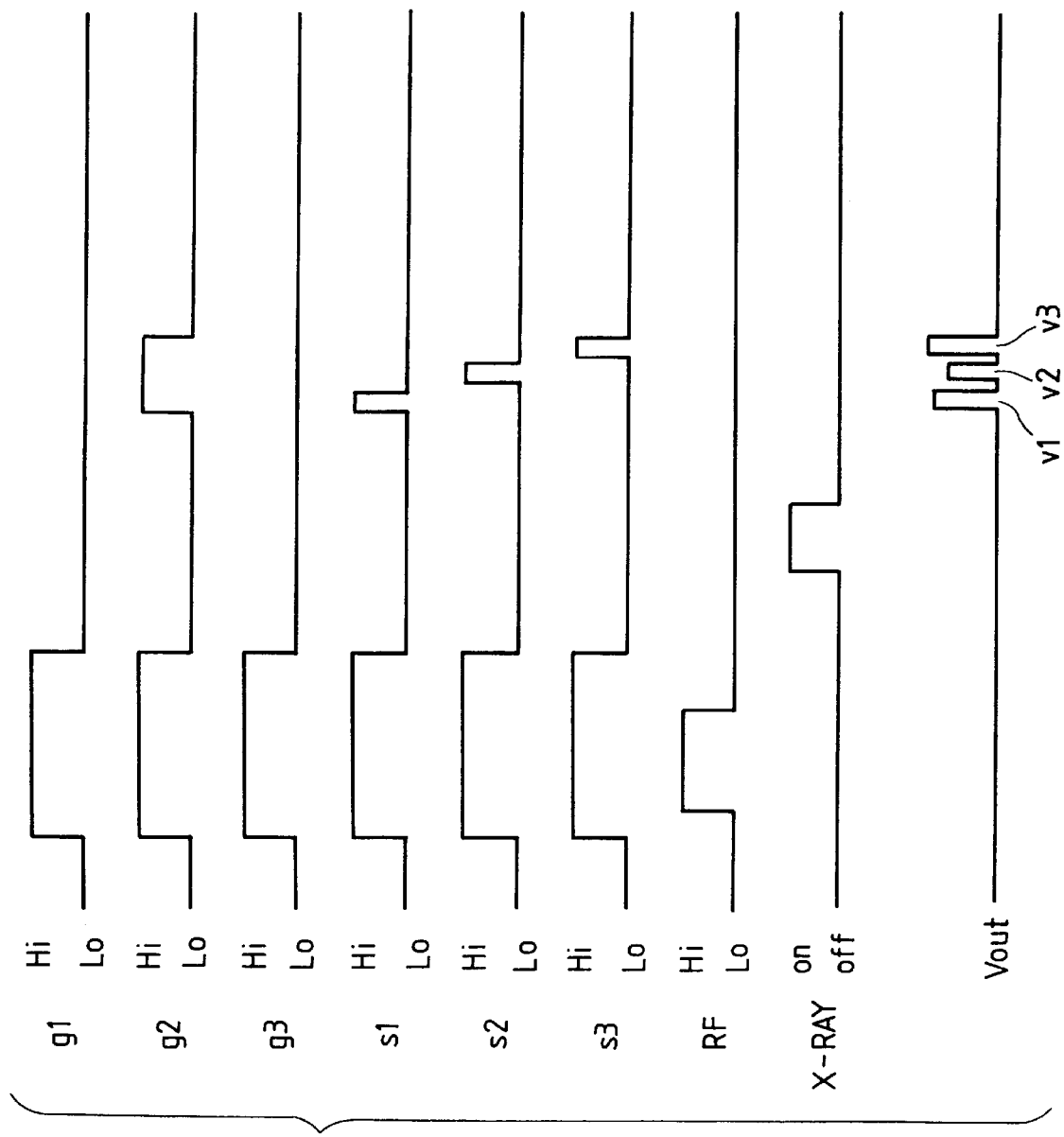

These operations are illustrated in a timing chart in FIG. 11. In this case not all the control lines g1–g3 are driven after the exposure to the X-ray irradiation, but the control line g2 alone, corresponding to the desired reading area, is drive while other control lines g1, g3 remain undriven.

As shown in FIG. 11, the control lines g1, g3 are also driven only at a timing when the control line g2 is also driven, for the purpose of initialization. In this manner the information of the interest area can always be obtained with stable characteristics.

For enabling such control, the present embodiment is provided with a control circuit A for controlling the shift registers SR1 and SR2 as shown in FIG. 9. More specifically, the control circuit A generates a signal capable of starting the shift register SR1 from an arbitrarily designated address and stopping it at an arbitrarily designated address, and also generates start and stop signals for determining the addresses and the number of repetition of the register SR2 according to the number of driven addresses of the register SR1. In this manner the output signals can be obtained from the required photoelectric converting elements. Such control circuit, being capable of recognizing the entered bit numbers of the sensors, is composed of logic circuits, but it may also be composed of circuits utilizing a microcomputer.

The required two-dimensional information, representing for example the internal structure of the human body, can thus be obtained as v1–v3, by the control of the shift registers SR1 and SR2 by the control circuit A. A still image can be obtained by the above-explained process, but such process is repeated in order to obtain a moving image.

In the present embodiment there has been explained a case of two-dimensionally arranging nine pixels into a 3×3 matrix and outputting the signals of only three pixels therein, but the trimming can be achieved by driving, by the shift registers, any plural desired drive lines in succession.

In the present embodiment, in a photoelectric conversion device for reading in succession the signals from plural photoelectric converting elements arranged in a two-dimensional array on a substrate, by successively scanning the drive lines in the X-direction thereby transferring the signal charges in the signal lines in the Y-direction, the arbitrarily selected necessary drive lines alone are scanned in succession while the remaining drive lines are.not driven for the purpose of signal charge transfer. Such photoelectric conversion device, capable of dispensing with the time required for driving the unnecessary drive lines and for reading the unnecessary output signals, can read the necessary signals at a higher speed. Thus, in case the photoelectric conversion device is utilized as an X-ray image capture device, particularly in case of observation of a moving image by continuous irradiation of such image capture device with X-ray, there can be achieved a reduction in the X-ray radiation dose, providing a medically and environmentally significant advantage, because the above-explained drive method practically corresponds to an increase in the sensitivity, as the exposure time can be extended if the number of exposures per unit time is maintained constant.

[Fourth embodiment]

This embodiment utilizes the photoelectric conversion device of the third embodiment for switching the drive method with trimming according to the timing chart shown in FIG. 11 and the drive method for reading all the pixels according to FIG. 6.

This embodiment provides the convenience for use as in the second embodiment, by switching the reading of all the pixels and the partial reading according to the necessity.

For enabling such control, the present embodiment is provided, as in the first embodiment, with a control circuit A for controlling the shift registers SR1 and SR2. The partial reading and the reading of all the pixels can be switched by the entry, into the control circuit A, of the name of the required output signals in case of the trimmed reading, or of the name of the required output signals of all the pixels in case of the reading of all the pixels.

Also in the present embodiment, an effect of moving image reading similar to that in the second embodiment can be obtained by alternate reading operations as in the second embodiment.

[Fifth embodiment]

Figure 12:
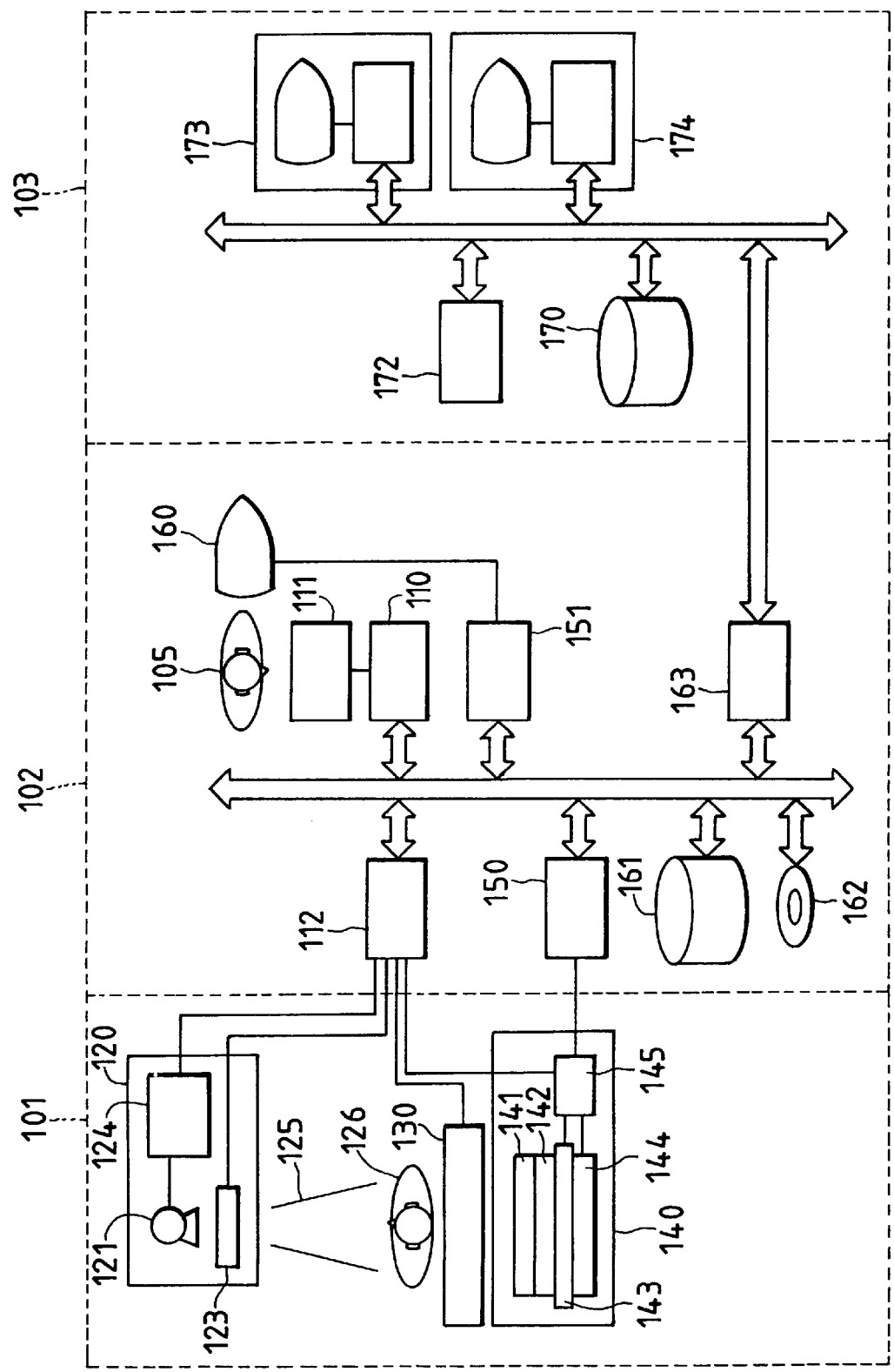
FIG. 12 is a schematic view showing the system configuration of an X-ray photographing system utilizing a two-dimensional photoelectric conversion device.

Now reference is made to FIG. 12 for explaining a drive method for the photoelectric conversion device, constituting the image signal reading method of the present embodiment, and an X-ray image capture system utilizing the photoelectric conversion device enabling such drive method. However such system is naturally applicable also in the foregoing embodiments.

Referring to FIG. 12, an X-ray image capture system is composed of an X-ray chamber 101, an X-ray control room 102 and a diagnosis room 103. It is also possible to construct the X-ray image capture system without the diagnosis room 103, and to connect a LAN as 103 to such X-ray image capture system.

The functions of the entire X-ray image capture system are controlled by a system control unit 110, which principally performs the following functions. At first, it receives an instruction from an operator 105 through a user interface 111, which can be, for example, a touch panel on a display, a mouse, a keyboard, a joy stick or a foot switch. The content of such instruction may include the image capture conditions (still image, moving image, voltage and current of X-ray tube, X-ray irradiation time etc.), the image capture timing, the image processing conditions, the ID of the patient, the processing method for the captured image etc. Based on the image capture conditions instructed from the operator 105, the system control unit 110 sends an instruction to an image capture control unit 112, controlling the X-ray image capture sequence, and fetches the data. Based on the instruction from the system control unit 110, the image capture control unit 112 drives an X-ray generating unit 120, an image capture base (specimen table) 130 and an X-ray detector 140 to fetch image data, then transfers the image data to an image processing unit 150 for effecting the image processing designated by the operator, displays an image on a display 160 through a display drive circuit 151, and stores the basic image process data in an external memory 161. Then, also based on the instruction of the operator 105, the system control unit 110 effects, for example, repeated image processing, display of reproduced image, transfer of image data to the devices on the network (LAN), storage of the image data, display thereof and/or printing thereof on a film.

In the following the system will be explained further, according to the flow of the signals.

The X-ray generating unit 120 is provided with an X-ray tube 121 and an X-ray diaphragm 123. The X-ray tube 121 is driven by a high-voltage source 124 controlled by the image capture control unit 112 and emits an X-ray beam 125. The X-ray diaphragm 123, driven by the image capture control unit 112, shapes the X-ray beam 125 for avoiding the X-ray irradiation to the unnecessary area, according to the change in the image capture area. The X-ray beam 125 is directed to a specimen 126 placed on the X-ray transmitting image capture table 130, which is driven two-dimensionally, perpendicular to the irradiating direction of the X-ray beam 125, according to the instruction of the image capture control unit 112. The X-ray beam 125 reaches the X-ray detector 140 after passing the specimen 126 and the table 130.

The X-ray detector 140 is provided with a grid 141, a scintillator (fluorescent member) 142, a photoelectric converting element array (photodetector array) 143, an X-ray radiation dose monitor 144 and a drive circuit 145. The grid 141, serving to reduce the influence of the X-ray scattering caused by the transmission of the specimen 126, is composed of a low X-ray absorbing material and a high X-ray absorbing material, such as Al and Pb arranged in a stripe structure. The grid 141 is vibrated according to the instruction of the image capture control unit 112, in order to avoid moire fringe generation by the relationship of the grating structures of the photodetector array 143 and the grid 141. In the scintillator 142, the base material of the fluorescent member is excited by absorbing the X-ray of high energy and fluorescent light of visible range by the energy of recombination. Such fluorescent light is obtained either from the base material itself, such as $CaWO_4$ or $CdWO_4$, or from light emitting centers formed by activation materials in the base material such as CsI:Tl or ZnS:Ag. Adjacent to the scintillator 412 there is provided the photodetector array 143, which converts the photons into electrical signals. The X-ray radiation dose monitor 144 monitors the amount of the transmitted X-ray, either by directly detecting the X-ray for example with a crystalline silicon photosensor or by detecting the light from the scintillator 142. As an example, the visible light transmitted by the photodetector array 143 and proportional to the X-ray radiation dose may be detected by an amorphous silicon photosensor formed on the substrate of the photodetector array 143. The detection signal of the monitor 144 is supplied to the image capture control unit 112, which in response controls the high voltage source 124 to intercept or regulate the X-ray. The drive circuit 145 drives the photodetector array 143 and reads the signals from the detecting elements, under the control of the image capture control unit 112. The photodetector array 143 and the drive circuit 145 will be explained later.

The image signal (image data) from the X-ray detecting unit 140 is transferred from the X-ray chamber 101 to the image processing unit 150 in the X-ray control room 102. Since noises are often generated at the X-ray emission in the X-ray chamber 101, the transfer of the image data may be affected by such noises. For this reason there is preferably employed a transmission path with a high noise resistance, such as a transmission system having error correcting function, shielded and twisted paired wires combined with a differential driver, or an optical fiber transmission path. The image processing unit 150 executes image data correction, spatial filtering, recursive process etc. on real-time basis. It can also execute gradation process, correction for scattering, DR compression etc. The image thus processed is displayed on a display unit 160. Simultaneously with the read-time image processing, the basic image after data correction is stored in a high-speed memory 161, which is preferably composed of a data storage device of a large capacity, a high speed and high reliability, for example a hand disk array such as RAID.

Also based on the instruction of the operator 105, the image data stored in the high-speed memory 161 are stored in an external memory device, with such data reconstruction as to satisfy a predetermined standard (such as IS&C). The external memory device is composed, for example, of a magnetooptical disk 162 or a hard disk in a file server 170 on the LAN. The present X-ray image capture system can be connected to the LAN 103 through a LAN board 163, and is to constructed as to be compatible with the data of the HIS (hospital information system). To the LAN, there may be connected not only plural X-ray image capture systems but also a monitor 174 for displaying a still image or a moving image, a file server 170 for filing the image data, an image printer 172 for printing the image on a film, an image processing terminal 173 for effecting complex image processing and supporting the diagnosis etc. The present X-ray image capture system releases the image data according to a predetermined protocol, such as DICOM. It also enables, by a monitor connected to the LAN, the real-time remote diagnosis by the doctor at the X-ray image capture.

Figure 13:
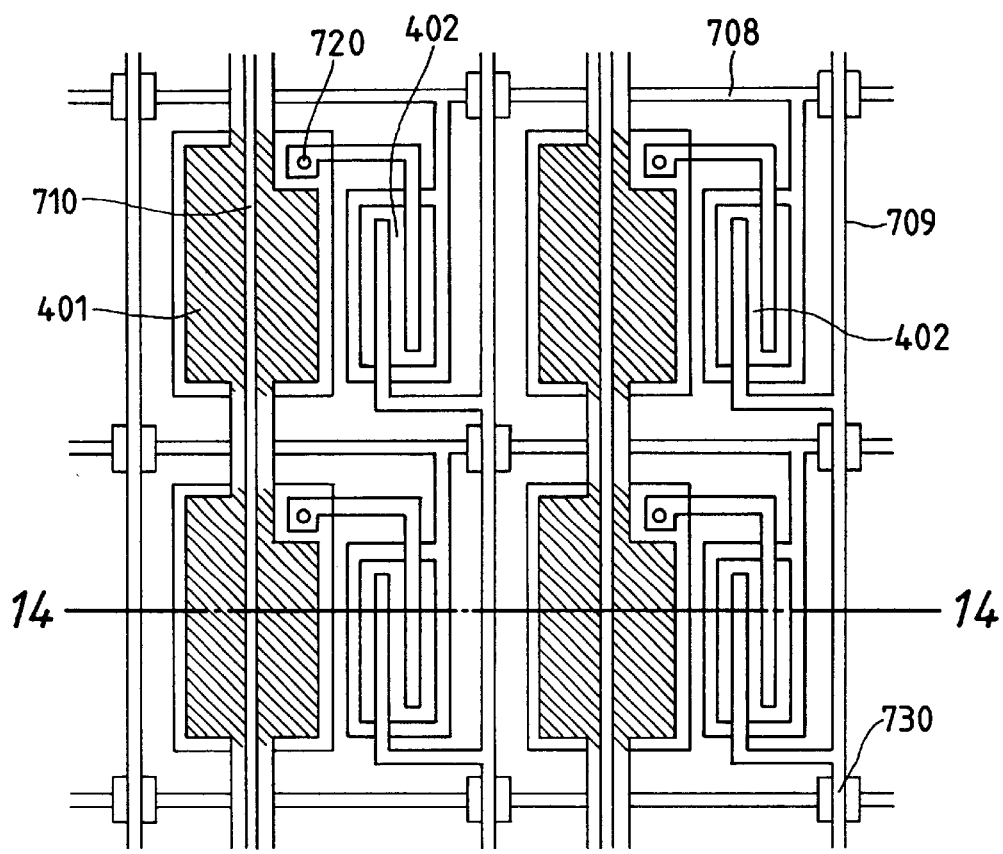
FIG. 13 is a schematic plan view of a pixel structure of the photoelectric converting element.
Figure 14:
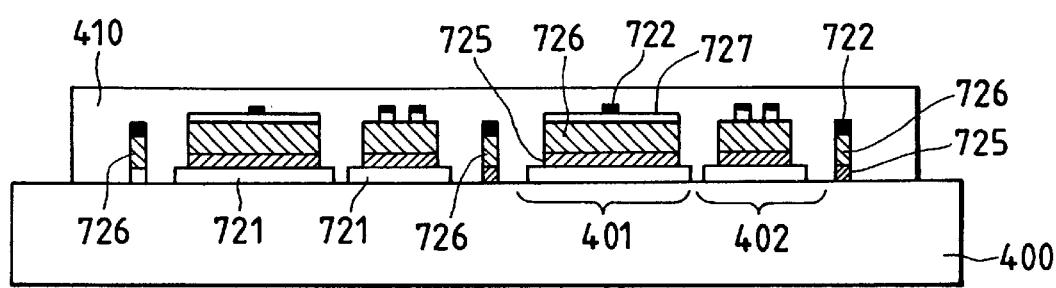
FIG. 14 is a schematic cross-sectional view of an example of the pixel structure of the photoelectric converting element.

FIG. 13 is a schematic plan view of a portion of four detecting elements (4 pixels) of an example of the photodetector array 143, and FIG. 14 is a cross-sectional view along a line 14—14.

Each detecting element is provided with a photoelectric converting element 401 and a switching element 402. In FIG. 13, a hatched area indicates a light-receiving face of the photoelectric converting element 401, for receiving the fluorescent light from the scintillator 141. A signal charge, obtained by the photoelectric conversion in the photoelectric converting element 401, is transferred to the processing circuit through the switching element 402. There are also shown a control line 708 for controlling the switching element 402, a signal line 709 connected to the processing circuit, a power supply line 710 for applying a bias to the photoelectric converting element, and a contact hole 720 connecting the photoelectric converting element 401 and the switching element 402.

In the following there will be explained an example of the method for forming the detecting element including the photoelectric converting element and the switching element.

At first chromium (Cr) is evaporated by sputtering or by resistance heating onto an insulating substrate 400 to form a first thin metal film 721 with a thickness of about 500 Å. The film is then patterned by a photolithographic process and the unnecessary areas are etched off. The first metal film 721 constitutes the lower electrode of the photoelectric converting element 401 and the gate electrode of the switching element 402. Then a-SiNx (725), a-Si:H (726) and n+-layer (727) are deposited in succession, by CVD in the same vacuum environment, with respective thicknesses of 2000, 5000 and 500 Å. These layers respectively constitute the insulation layer/photoelectric converting semiconductor layer/hole injection inhibiting layer of the photoelectric converting element 401, and the gate insulation layer/ semiconductor layer/ohmic contact layer of the switching element (TFT) 402. They are used also as an insulation layer in a crossing-area (730 in FIG. 13) of the first metal film 721 and a second metal film 722. The thicknesses of these layers are not limited to the above-mentioned figures but can be optimally designed according to the voltage and charge of the detecting element, the amount of fluorescent light entering from the scintillator etc. At least the a-SiNx layer 725 preferably has a thicknesses of 500 Å or larger, in order to inhibit the passing of the electrons and the holes and to satisfactorily function as the gate insulation film of the TFT 402.

After the deposition of the above-mentioned layers, an area for forming the contact hole (720 in FIG. 13) is dry etched by RIE or CDE, and aluminum (Al) is deposited, as a second metal film 722, by sputtering or by resistance heating, with a thickness of about 10,000 Å. The film is then patterned by a photolithographic process and the unnecessary areas are etched off. The second metal film 722 constitutes the upper electrode of the photoelectric converting element 401, the source and drain electrodes of the switching TFT 402, and other wirings. Simultaneous with the formation of the second metal film 722, it is connected with the first metal film 721 at the contact hole. Also for forming the channel part of the TFT 402, an area between the source and drain electrodes is etched by RIE, and then the unnecessary a-SiNx layer, a-Si:H layer and n+-layer are etched off by RIE to isolate the elements. In this manner there are formed the photoelectric converting element 401, the switching TFT 402, other wirings 708, 709, 710 and the contact hole 720.

Though the cross-sectional view in FIG. 14 illustrates only two pixels, a plurality of the pixels are naturally formed simultaneously on the insulating substrate 400. Finally, for improving the moisture resistance, the elements and the wirings are covered, for example, by a passivation film (protective film) 410 composed of SiNx (amorphous material containing silicon atoms and nitrogen atoms).

As explained in the foregoing, the photoelectric converting element 401, the switching TFT 402 and the wirings can be formed by suitably etching the first metal film, the a-SiNx layer, the a-Si:H layer (amorphous material based on silicon atoms and containing hydrogen atoms), the n+-layer (amorphous material based on silicon atoms and containing hydrogen atoms and phosphor or arsine atoms), and the second metal film, which are deposited in common and simultaneous manner. Also the photoelectric converting element includes only one injection inhibiting layer, which can be formed in the same vacuum chamber as that for other layers.

In the following there will be explained the function of the photoelectric converting element 401 alone.

Figure 15A:
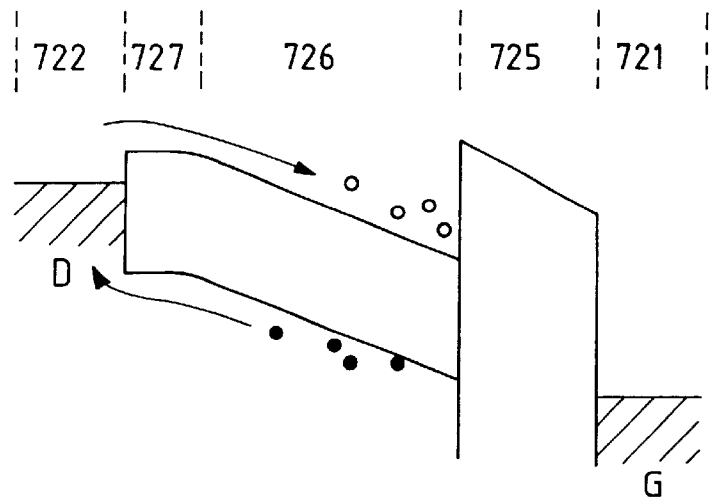
FIGS. 15A, 15B and 15C are schematic energy band charts showing an example of the function of the photoelectric converting element.
Figure 15B:
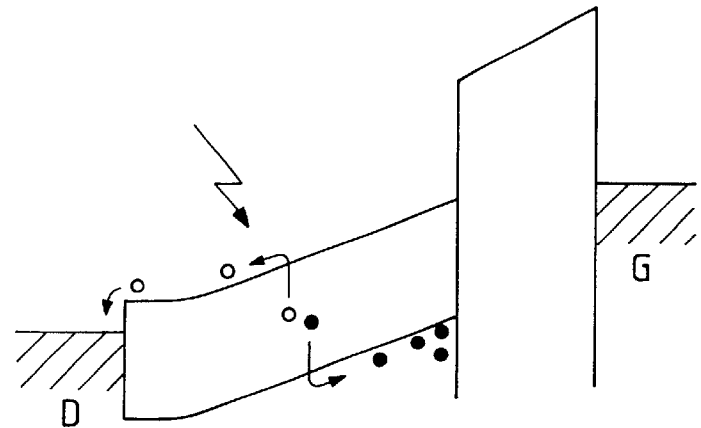
Figure 15C:
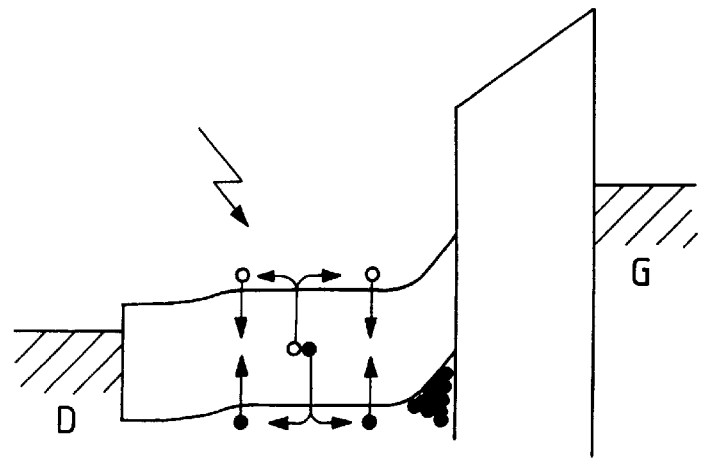

FIGS. 15A to 15C show the energy band of the photoelectric converting element 401, in a direction across the constituent layers thereof. FIGS. 15A and 15B respectively show the function states in the refreshing mode and the photoelectric conversion mode, wherein shown are a lower electrode 721 composed of chromium (hereinafter written as G electrode), a SiNx insulation layer 725 for inhibiting the passing of the electrons and the holes, with a thickness of about 500 Å capable of inhibiting the passing of the electrons and the holes even under the tunneling effect, a photoelectric converting semiconductor layer 726 which is an intrinsic semiconductor layer composed of hydrogenated amorphous silicon a-Si:H, an injection inhibiting layer 727 which is an a-Si n-layer for inhibiting the injection of the holes into the photoelectric converting semiconductor layer 726, and an Al upper electrode 722 (hereinafter written as D electrode). Though the D electrode does not completely cover the n-layer, they are always at a same potential because of free electron movement therebetween, and this fact is utilized in the following description. The photoelectric converting element has two function states, namely the refreshing mode and the photoelectric conversion mode, depending on the manner of voltage application to the D and G electrodes.

In the refreshing mode, the D electrode is given a negative position with respect to the G electrode as shown in FIG. 15A, whereby the holes represented by the black circles in the i-layer 726 are guided by the electric field to the D electrode. At the same time, the electrons represented by the white circles are injected into the i-layer 726. In this state, a part of the holes and a part of the electrons recombine and vanish in the n-layer 727 and in the i-layer 726. If this state continues sufficiently long, the holes in the i-layer 726 are removed therefrom.

The refreshing mode is shifted to the photoelectric conversion mode by giving a positive potential to the D electrode, with respect to the G electrode, as shown in FIG. 15B. In response, the electrons in the i-layer 726 are instantaneously guided to the D electrode. However the holes are not guided to the i-layer 726 since the n-layer 727 functions as the injection inhibiting layer. If the light enters the i-layer 726 in this state, the light is absorbed to generate pairs of electrons and holes. The electrons are guided by the electric field to the D electrode. On the other hand, the holes move in the i-layer 726 and reach the interface with the insulation layer 725 and, as they cannot enter the insulation layer 725, they gather at the above-mentioned interface. In response, a current flows out from the G electrode in order to maintain the electrical neutrality of the element This current, corresponding to the electron-hole pairs generated by the light, is proportional to the amount of the incident light. If the element is maintained in the photoelectric conversion mode shown in FIG. 15B for a certain period and is then shifted to the refreshing mode shown in FIG. 15A, the holes retained in the i-layer 726 are guided to the D electrode as explained above, and a current is simultaneously generated corresponding to these holes. The amount of such holes corresponds to the total amount of the light received during the photoelectric conversion mode. In this state there is also generated a current corresponding to the amount of the electrons injected into the i-layer 726, but the amount of such current, being almost constant, can be subtracted at the detection. In this manner the photoelectric converting element can output not only the amount of incident light on real-time basis but also the total amount of light received in a certain period.

However, if the period of the photoelectric conversion mode is extended or the intensity of the incident light becomes stronger for some reason, the current generation may be suspended despite of the presence of the incident light. Such situation is induced by a fact that a large number of holes remain in the i-layer 726 and recombine with the generated electrons. There may be generated an unstable current if the state of the incident light varies in this state, but the holes in the i-layer 726 are removed by shifting the element to the refreshing mode again, and a current proportional to the incident light is obtained again in the next photoelectric conversion mode.

In removing the holes from the i-layer 726 in the refreshing mode explained above, it is desirable to remove all the holes, but a partial removal of the holes is also effective and can provide a current same as explained above. More specifically it is required that the state shown in FIG. 15C does not occur at the detection in the next photoelectric conversion mode, and the potential of the D electrode relative to that of the G electrode in the refreshing mode, the period thereof and the characteristics of the injection inhibiting n-layer 727 can be so selected as to satisfy such requirement. Also in the refreshing mode, the electron injection into the i-layer 726 is not essential. Also the potential of the D electrode need not necessarily be negative relative to that of the G electrode, since, in case a large number of holes remain in the i-layer 726, the electric field therein is generated in a direction to guide the holes toward the D electrode even if the potential of the D electrode is positive relative to that of the G electrode. Also the injection inhibiting n-layer 727 is not necessarily required to inject the electrons into the i-layer 726. The foregoing explanation of the photoelectric converting element is basically applicable to the foregoing embodiments.

In the following there will be explained the function of the detecting element of a pixel in the X-ray image capture device, with reference to FIGS. 16 and 17.

Figure 16:
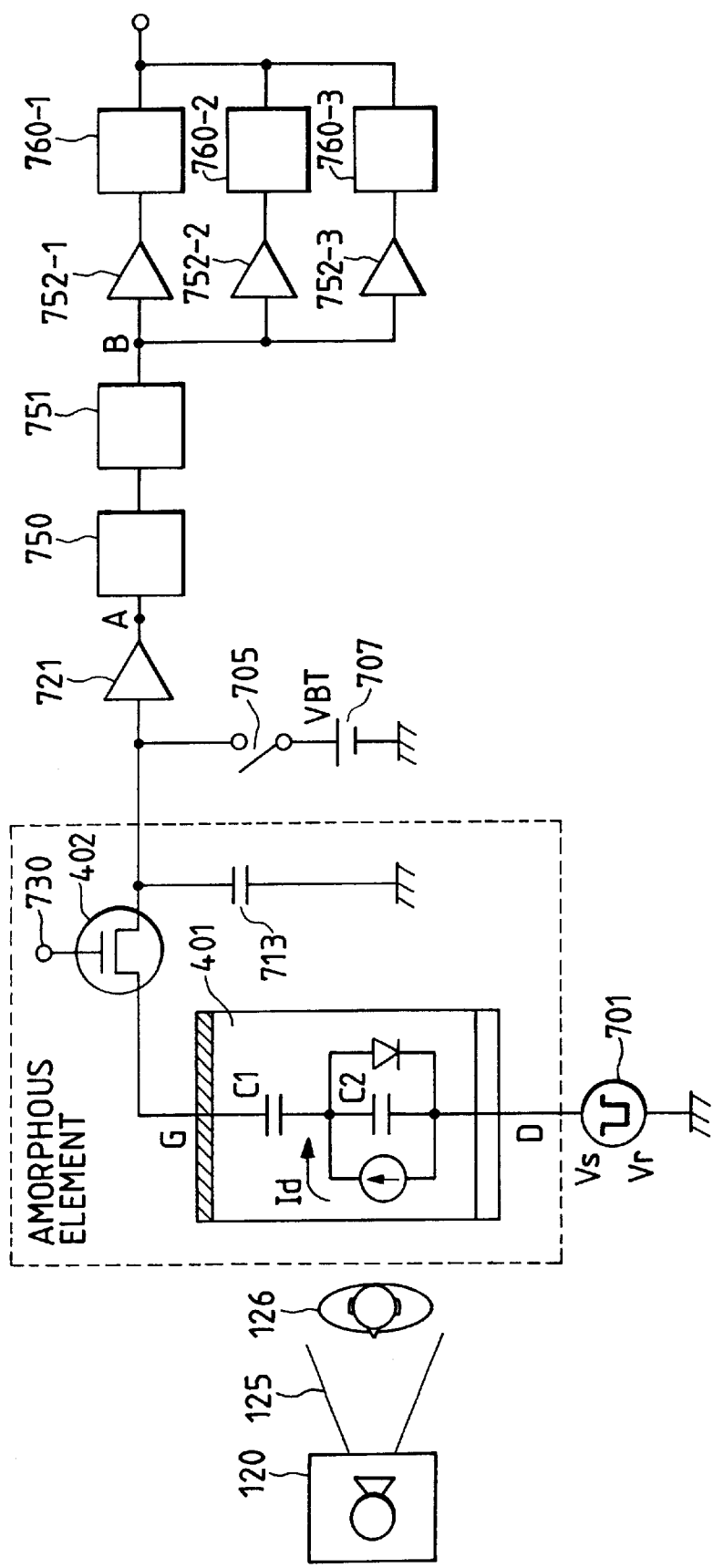
FIG. 16 is a schematic equivalent circuit diagram of an example of drive of a photoelectric converting element.
Figure 17:
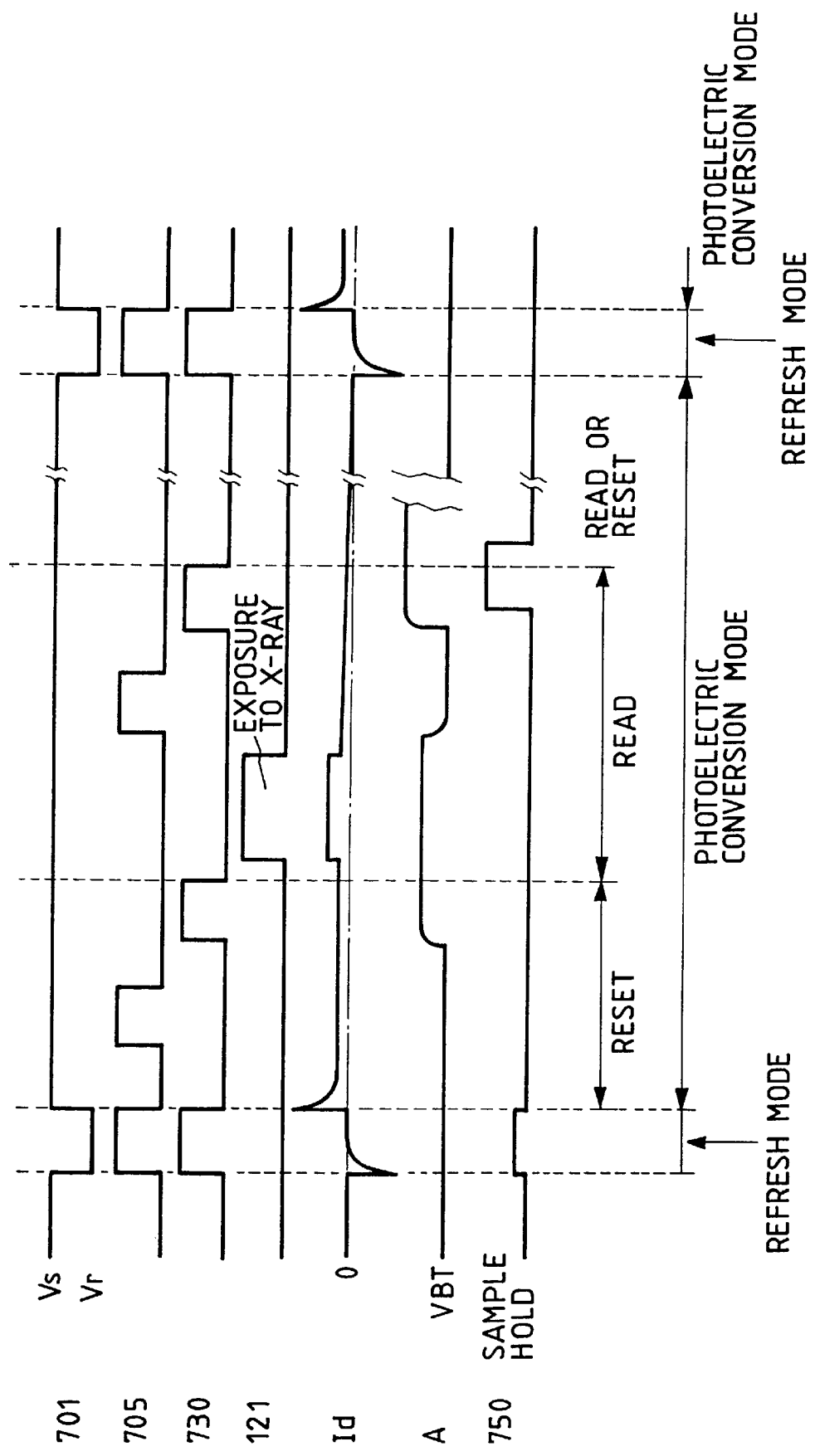
FIG. 17 is a timing chart showing an example of drive of the photoelectric conversion device.

FIG. 16 is an equivalent circuit of a pixel, including the photoelectric converting element 401 and the switching TFT 402, and FIG. 17 is a timing chart showing the function of such circuit. As explained in the foregoing, the present detecting element has two modes, namely the refreshing mode for initializing the photoelectric converting element 401, and the photoelectric conversion mode for accumulating the received light in the form of a charge.

Immediately after the power supply is turned on, there is assumed the refreshing mode in order to initialize the photoelectric converting element 401. A bias power source 701 applies a voltage corresponding to the mode (refreshing mode or photoelectric conversion mode). In the refreshing mode, the bias power source 701 is set at a voltage Vr for the refreshing mode, and a voltage Vgh is applied to the gate 730 of the switching TFT 402 to turn on the TFT 402. At the same time, a resetting switch element 705 is turned on, whereby the D and G electrodes of the photoelectric converting element 401 are respectively set at a voltage Vr and a bias voltage VBT of a resetting power source 707 (Vr<VBT).

After the lapse of a predetermined time, the circuit is shifted from the refreshing mode to the photoelectric conversion mode, in which the bias power source 701 is set at a voltage Vs for the photoelectric conversion mode and the switching TFT 402 is turned off. At the same time the resetting switch element 705 is turned off, and the charge accumulation in capacitors C1 and C2 is started immediately thereafter.

Immediately after the shift from the refreshing mode to the photoelectric conversion mode, the photoelectric conversion unit has a large dark current. In order to suppress the influence of such dark current, the G electrode in the photoelectric converting element 401 is again set at a voltage VBT after the lapse of a predetermined time from the shift to the photoelectric conversion mode. In more details, while the bias power source 701 is maintained at a voltage Vs, the resetting switch element 705 is turned on to maintain a capacitance element 713 at a voltage VBT, and the resetting switch element 705 is then turned off. Then the switching TFT 402 is turned on while the bias power source 701 is maintained at the voltage Vs, thereby resetting the capacitor C1 in the photoelectric converting element 401. The accumulation of the signal charge in the capacitor C1 of the photoelectric converting element 401 is initiated when the switching TFT 402 is turned off.

Subsequently the X-ray generating unit 120 emits the X-ray 125, which is converted, after passing the specimen 126 and the grid 141, by the scintillator 142 into the light in the sensitivity range (for example wavelength $\lambda$=550 nm) of the photoelectric converting element 401, and thus converted light is further subjected to the photoelectric conversion in the photoelectric converting element 401. As the a-SiNx insulation layer 725 and the a-Si:H photoelectric semiconductor layer 726, constituting the photoelectric converting element 401, are dielectric, the element 401 functions as a capacitance element and stores the signal charge in the capacitor C1 therein.

After the X-ray irradiation, the TFT 402 is turned on to transfer the accumulated charge signal from the capacitor C1 in the element 401 to a capacitance element 713. In fact electrons flow from the capacitance element 713 into the capacitor C1. The capacitance element 713 is not particularly formed as an element in the circuit shown in FIG. 13, but is inevitably formed by the capacitance between the upper and lower electrodes of the TFT 402 or by a crossing portion 730 of the signal line 709 and the gate line 708. However it may naturally be designed and prepared as a separate element.

The above-explained operations, except for the power supply and the control of the TFT 402, are executed by amorphous devices formed on the insulating substrate.

Then the signal potential of the capacitance element 713 is amplified 10 to 100 times by a pre-amplifier 721, and is held in a succeeding sample-hold unit 750 at a timing shown in FIG. 17. The amplification gain is fixed during the measurement, but is switchable by an instruction from a system control unit 110, according to the purpose of the operator. The pre-amplifier 721 and the sample-hold unit 750 may be replaced by a current-voltage converting circuit. While the sample-hold unit 750 releases the signal to the subsequent circuits, the photoelectric converting element 401 effects at the same time the accumulation of the signal charge and the charge transfer to the capacitance element 713, and the driving speed per element is elevated by such pipeline process. The output of the sample-hold unit 750 is supplied through an analog multiplexer 751 (of which drive method will be explained later in the description of two-dimensional drive) to three amplifiers 752 (752-1, 752-2, 752-3), having respective gains of x1, x2 and x4 and respectively connected to A/D converters 760-1, 760-2, 760-3. The A/D converters 760 complete the A/D conversion while the signal of the analog multiplexer 751 is fixed, then select an effective A/D conversion output from the converters 760-1, 760-2, 760-3 based on an overflow signal of the input signal to the A/D converters 760, and provides the succeeding image process unit 150 with the selected A/D conversion output together with the overflow signal of the A/D converters 760. By the above-explained configuration, the three A/D converters function as a single A/D converter with automatic range switching function.

Then, in order to again read the signal charge (accumulated after the TFT gate 730 is turned off before) from the capacitor C1 of the photoelectric converting element 401, a resetting switch element 705 is turned on while the gate 730 is turned off, thereby resetting the capacitance element 713 to the voltage VBT. After this state is reached, the resetting switch element 705 is turned off, and the gate 730 of the TFT 402 is turned off. Thus a signal charge, corresponding to the amount of X-ray irradiation from the previous turn-off of the TFT 402 to the present turn-on thereof, is sent to the capacitance element 713. Thereafter the signals can be read in succession, by repetition of the above-explained signal reading operation from the capacitance element 713.

As the capacitor C2 in the photoelectric converting element 401 becomes saturated by the continuation of the signal reading operation, it is necessary to shift the element from the photoelectric conversion mode to the refreshing mode at a predetermined interval and to refresh the element by removing the charge (positive holes) accumulated in the capacitor C2 of the photoelectric converting element 401. The signal reading is executed by repeating the above-explained operations.

For obtaining the charge signal of a higher S/N ratio, there may be executed a correction for the offset error resulting from the dark current. As the dark current of the above-explained photoelectric converting element is known to exponentially decrease as a function of time, a signal reading operation is repeated without X-ray irradiation at a predetermined time after the above-explained signal reading operation. The signal obtained by such repeated signal reading corresponding to the offset caused by the dark current, and the correction for the offset by the dark current can be made for the previously obtained signal including the X-ray irradiation, based on such offset value, the charge accumulation time and the time after the refreshing. In case of capturing a still image, the data correction can be made by a software process after the image data are fetched for example in a RAM in the image process unit 150. In case of a moving image, the offset correction may be achieved by repeating the reading of the X-ray irradiation signal and that of the dark current in every predetermined accumulation time, storing thus read signals for example in a RAM and effecting digital subtraction by a hardware process.

Figure 18:
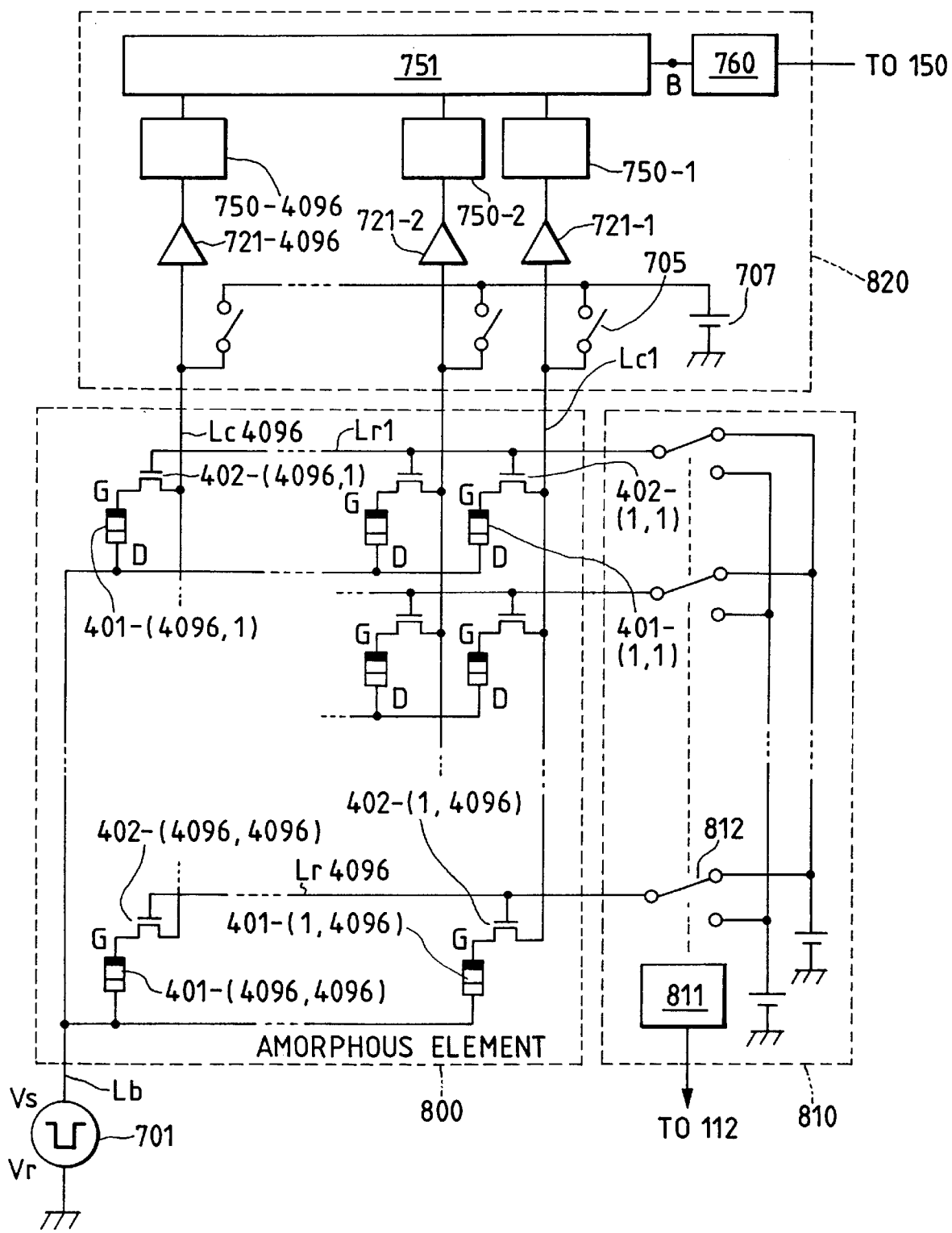
FIG. 18 is a schematic equivalent circuit diagram of an example of drive of a photoelectric converting element.
Figure 19:
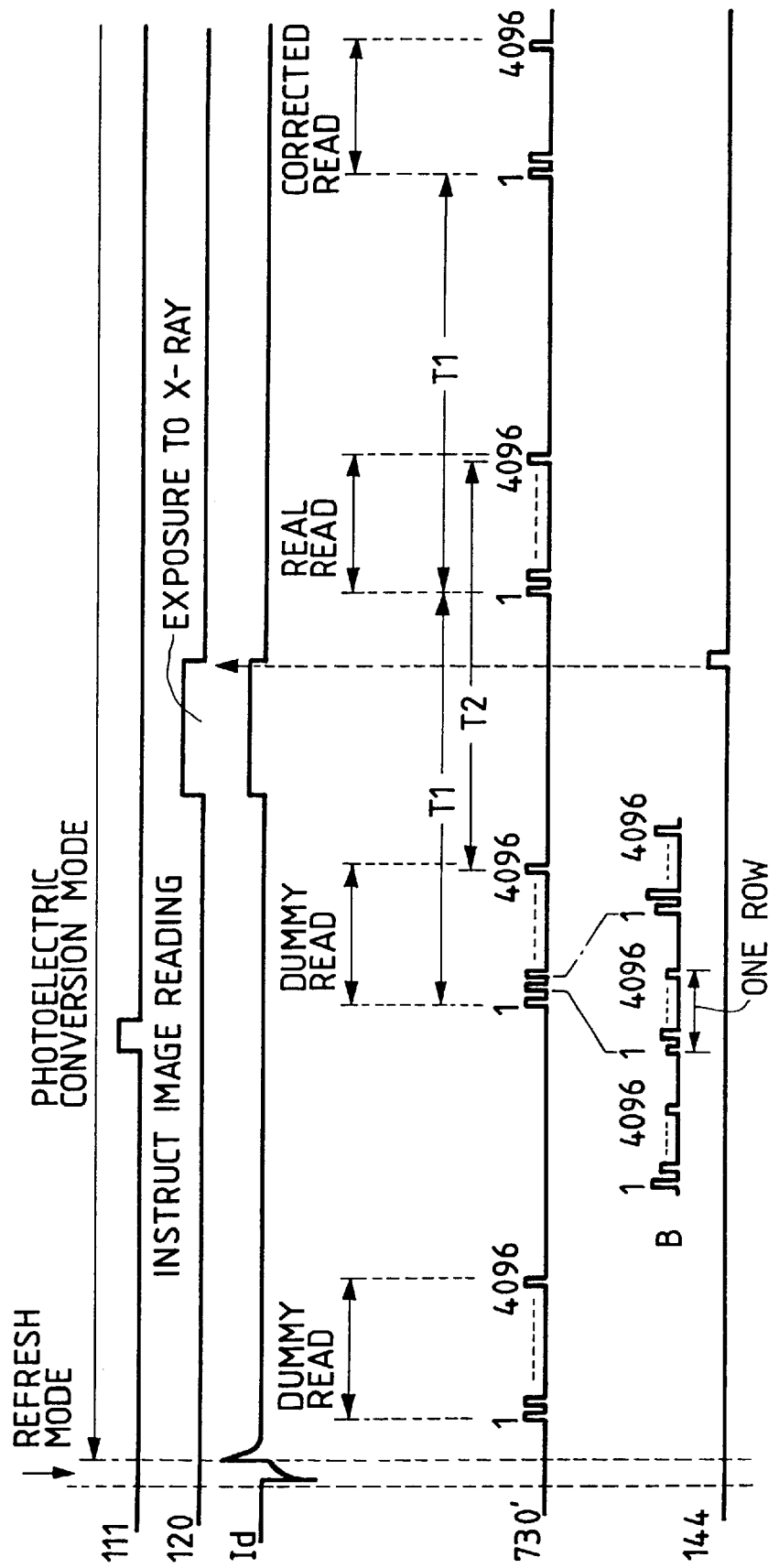
FIG. 19 is a timing chart showing an example of drive of the photoelectric conversion device.

In the following there will be explained a photoelectric converting operation in case the detecting element shown in FIG. 16 is expanded to a two-dimensional array. FIG. 18 is an equivalent circuit diagram of a two-dimensional array of the photoelectric converting elements, and FIG. 19 is a timing chart showing the function thereof.

A photodetector array 143 is composed of 2000×2000 to 5000×5000 detecting elements (pixels) and has an area of 200×200 to 500×500 mm. In FIG. 17, the array 143 is composed of 4096×4096 pixels of an area of 430×430 mm, so that each pixel has a size of 105 µm. A two-dimensional array is obtained by arranging 4096 pixels of a block in a horizontal line, and arranging such 4096 lines in the vertical direction.

In the above-explained configuration, the photodetector array of 4096×4096 pixels is formed on a single substrate, but it may also be composed of four photodetector arrays each having 2048×2048 pixels. Such divided configuration provides the advantage of an improved yield in the manufacture.

As explained in the foregoing, each pixel is composed of a photoelectric converting element 401 and a switch TFT 402. The array has photoelectric converting elements 401-(1, 1) to 401-(4096, 4096), in which G and D respectively indicate the lower and upper electrodes, and switching TFT 402-(1, 1) to 402-(4096, 4096). The G electrodes of the photoelectric converting elements 401-(m, n) in each column of the two-dimensional photodetector array are connected, by the source-drain conductive paths of the corresponding switching TFT's 402-(m, n), to a common column signal line (Lc 1 to 4096) for that column. For example the photoelectric converting elements 401-(1, 1) to 401-(4096, 4096) of the first column are connected to the first column signal line Lc1.

The D electrodes of the photoelectric converting elements 401 of each row are commonly connected, through a bias line Lb, to the bias power source 701 for controlling the aforementioned modes. Also the gate electrodes of the TFT 402 of each row are connected to a row selecting line (Lr 1–4096). For example the TFT 402-(1, 1) to 402-(4096, 1) of the first row are connected to the row selecting line Lr1. The row selecting lines Lr are connected to a line selector unit 810, composed of an address decoder 811 and 4096 switch elements 812 and serving to read an arbitrary line Lrn. In simplest manner, the line selector 810 can also be composed of a shift register.

The column signal lines Lc are connected to a signal reading unit 820 controlled by the image capture control unit 112. The signal reading unit 820 is same, for each pixel, as the configuration already explained in FIG. 16.

In this image capture device, the 4096×4096 pixels are divided into 4096 lines (corresponding to Lr or the horizontal row in FIG. 18), and the outputs of 4096 pixels of a row are simultaneously transferred through the column signal lines Lc, the pre-amplifiers 721-1 to 721-4096 and the sample-hold units 750-1 to 750-4096, and are then released by an analog multiplexer 751 in succession to the A/D converter 760. In FIG. 18, there is illustrated only one A/D converter 760, but the A/D conversion may also be executed simultaneously in 4 to 32 lines, and such configuration allows to reduce the image signal reading time without unnecessarily increasing the analog signal band or the A/D conversion rate. The charge accumulation time is closely related to the A/D conversion time, and the time required for the A/D conversion of all the pixels is always longer than the charge accumulation time, because a proper image cannot be obtained if the X-ray irradiation is conducted during the charge transfer operation. A longer charge accumulation time results in an increase in the noise in the accumulated charge because of the dark current. On the other hand, in case of a high-speed A/D conversion, it is difficult to attain a desired S/N ratio because of the expanded bandwidth of the analog circuits. It is therefore required to reduce the reading time for the image signal without excessively increasing the A/D conversion speed. For this purpose the A/D conversion may be conducted with plural A/D converters 760, but an increased number of the A/D converters results in a higher cost. A suitable number of the A/D converters is to be selected in consideration of these factors.

Since the X-ray irradiation time is about 10 to 500 msec., the image fetching time or the charge accumulation time is preferably selected as about 100 msec. or somewhat shorter. If the analog signal bandwidth is selected as about 50 MHz and the A/D conversion is executed for example with a sampling rate of 10 MHz, the image fetching at 100 msec. requires at least 4 systems of the A/D converters 760. In the present image fetching device, the A/D conversion is preferably executed in 16 systems at the same time.

Referring to FIG. 19, immediately after the power supply is turned on or before the capacitor C2 in the photoelectric converting element 401 is saturated with the accumulated charge, the refreshing mode is assumed in order to initialize the photoelectric converting element 401. As already explained with respect to the photoelectric converting element of each pixel, the image capture control unit 112 shifts a bias line Lb to a bias Vr for the refreshing mode and turns on the transfer switching TFT's 402-(1, 1) to 402-(4096, 1) of the first row and the resetting switch element 705 to refresh the C electrodes of the photoelectric converting elements 401-(1, 1) to 401-(4096, 1) of the first row to VBT and the D electrodes thereof to Vr. Then the image capture control unit 112 shifts the bias line Lb to a bias Vs for the photoelectric conversion mode and cuts off the column signal lines Lc1–Lc4096 of the first to 4096th columns from the resetting power source 707, and turns off the transfer switching TFT's 402-(1, 1) to 402-(4096, 1). Subsequently the photoelectric converting elements 401 of the second and subsequent rows are refreshed in a similar manner. When the refreshing is executed to the 4096th row, the refreshing mode expanded to the two-dimensional photodetector array is completed and the operation is shifted to the photoelectric conversion mode. In the foregoing explanation, the refreshing of the photoelectric converting elements 401 is conducted from the first row to the 4096th row, but it may be executed in an arbitrary order by the instruction of the image capture control unit 112. It is also possible to simultaneously turn on all the TFT's 402, thereby refreshing all the photoelectric converting elements 401-(1, 1) to 401-(4096, 4096).

As the photodetector element 402 has a large noise charge immediately after the refreshing operation, it is reset to the reference potential. As already explained with respect to the photoelectric converting element of each pixel, the bias line is maintained at the bias Vs for the photoelectric conversion mode, and the transfer switching TFT's 402-(1, 1) to 402-(1, 4096) are turned on to reset the G electrodes of the photoelectric converting elements of the first column to VBT. Then these TFT's are turned off. Subsequently, all the pixels are reset by repeating the above-explained operation starting from the second column. For the amorphous element 800, this operation is same as the signal charge reading operation except for a difference whether or not to fetch the signal charge and to effect the A/D conversion. Such resetting operation, selecting each TFT 402 but not executing the A/D conversion, will hereinafter be called "dummy reading". In such dummy reading operation, though it is possible to simultaneously turn on all the TFT's 402-(1, 1) to 402-(4096, 4096), the potential of the signal lines in such case becomes significantly shifted from the reset voltage VBT at the completion of preparation for the reading operation, so that the signals of a high S/N ratio are difficult to obtain. In the foregoing example, the row selecting lines Lr are reset from the first to 4096th but the resetting may be executed in an arbitrary order under the instruction from the image capture control unit 112. As the charge accumulation starts when the TFT 402 is turned off in each photoelectric converting element 401, the every element 401 has different charge accumulation starting time.

In FIG. 19, a pulse train 730' conceptually indicates that a pulse turns on the TFT's of a column. The output of the analog multiplexer 751, indicated at a point B in FIG. 18, corresponding to a pulse in such pulse train, is schematically shown by B in FIG. 19. As shown therein, the analog output corresponding to a pulse in the pulse train is given by a pulse train consisting of 4096 pulses. More precisely, since the output signals of a column are given through 16 channels, 16 pulse signals are released simultaneously and the A/D conversion is executed for a pulse train consisting of 256 pulses.

After the dummy reading of all the photoelectric converting elements 401 is completed, such dummy reading operation is repeated at a predetermined interval and the refreshing operation is also repeated at a longer interval, until an instruction for starting the image capture is given by the operator 105. Upon receiving such instruction, the image capture control unit 112 waits until the completion of the dummy reading operation and effects the irradiation of the specimen 126 with X-ray. The X-ray beam 125 transmitted by the specimen 126 is converted by the scintillator 142 into a visible light, which is absorbed by the photoelectric converting elements 401. At the same time, the visible light transmitted by the photodetector array 143 is detected by the monitor 144. Based on the detection signal thereof, the image capture control unit 112 terminates the X-ray irradiation when an appropriate X-ray radiation dose is reached.

After the X-ray irradiation, the signal charges are read from the photoelectric converting elements 401. At first, as in the dummy reading operation, the TFT's of a row in the photodetector array (for example 402-(1, 1) to 402-(4096, 1)) are turned on to release the accumulated signal charges to the signal lines Lc1 to Lc4096, from which the signals of 4096 pixels are simultaneously read. After the signal lines Lc are reset, the TFT's 402 of a different row (for example 402-(1, 2) to 402-(4096, 2)) are turned on to release the accumulated signal charges to the signal lines Lc1 to Lc4096, from which the signals of 4096 pixels are simultaneously read. This operation is repeated in succession for all the rows thereby obtaining the entire image information.

After the reading of the signal charges obtained by the X-ray irradiation, the signal charges without the X-ray irradiation are also read, in order to correct the influence of the dark current etc. in such signal charges based on the X-ray irradiation. The image signals at the X-ray irradiation can be corrected in the following manner, by those without the X-ray irradiation.

In the above-explained operation, the charge accumulation period for each sensor is from the completion of the resetting operation, namely from the turn-off of the TFT 402 at the dummy reading, to the next turn-on of the TFT 402 for the charge reading operation. Thus the period and time of accumulation are different for each row selecting line Lr. As the correction becomes complex for such different accumulating periods, the image capture control unit 112 ordinarily drives the photodetector array 143 in such a manner that the accumulation time is same for the image based on the X-ray irradiation and for the correcting image. For example, the control is executed in such a manner that the accumulation period T1 of the first row becomes equal to that T2 of the 4096th row, though they occur at different times.

In case the image information of a high resolution is not required or in case a higher rate of image data fetching is desired, it is not always necessary to fetch all the image information, and the image capture control unit 112 may execute image skipping, pixel averaging or area extraction according to the selection of the operator.

The image skipping can be achieved by at first selecting the row selecting line Lr1, and, at the output of the signals of a row from the column signal lines Lc, by selecting every other column signal lines Lc(2n−1) starting from n=1, wherein n is a natural number. Also in the selection of rows, the signals are read from every other row by selecting the row selecting lines Lr(2m+1) starting from m=1, wherein m is a natural number. In this example, the number of pixels is skipped to ¼, but the skipping can also be realized for example at ⅑ or 1/16 according to the instruction from the image capture control unit 112.

The pixel averaging can be realized, in the above-explained operation, by applying Vgh simultaneously to the row selecting lines Lr(2m−1) and Lr(2m) to simultaneously turn on the TFT 402-(2n, 2m−1) and the TFT 402-(2n, 2m) thereby achieving analog addition of the two pixels in the direction of column. Such addition is not limited to two pixels, but an analog addition of three or more pixels arranged along the column signal line Lr can be easily achieved. Also the addition in the direction of row can be achieved by a digital addition of the signals of mutually adjacent columns (Lc(2n) and Lc(2n+1)) after the A/D conversion. Thus, in combination with the analog addition mentioned above, there can be obtained the added value of 2×2 pixels in a matrix arrangement. In this manner the data can be read at a high speed, without wasting the irradiating X-ray. It is naturally possible also to effect averaging in a matrix other than 2×2, and high-speed image capture with a matrix for example 3×3 or 4×4 can be achieved according to the instruction of the image capture control unit 112.

The area extraction is to achieve a higher speed by reducing the number of pixels to be read, and is realized by limiting the image reading area. The operator 105 instructs a necessary area through the operator interface 111, and, based on such instruction, the image capture control unit 112 varies the data reading area in driving the two-dimensional detector array 143.

As an example of such drive, let us consider a case of capturing, in a high-speed image capture mode, the data of 1024×1024 pixels at a rate of 30 frames/sec. In such case, if the image is captured over the entire area of the two-dimensional detector array 143, the number of pixels is skipped to $\frac{1}{16}$ by an addition process of 4×4 pixels, but, if the image is captured in a smallest area, the image is captured without skipping in an area of 1024×1024 pixels. Such operation enables digital zooming of the image.

In the following there will be explained the interest area. At first there will be explained the method for setting the image capture area in the present X-ray image capture device, with reference to FIG. 20.

Figure 20:
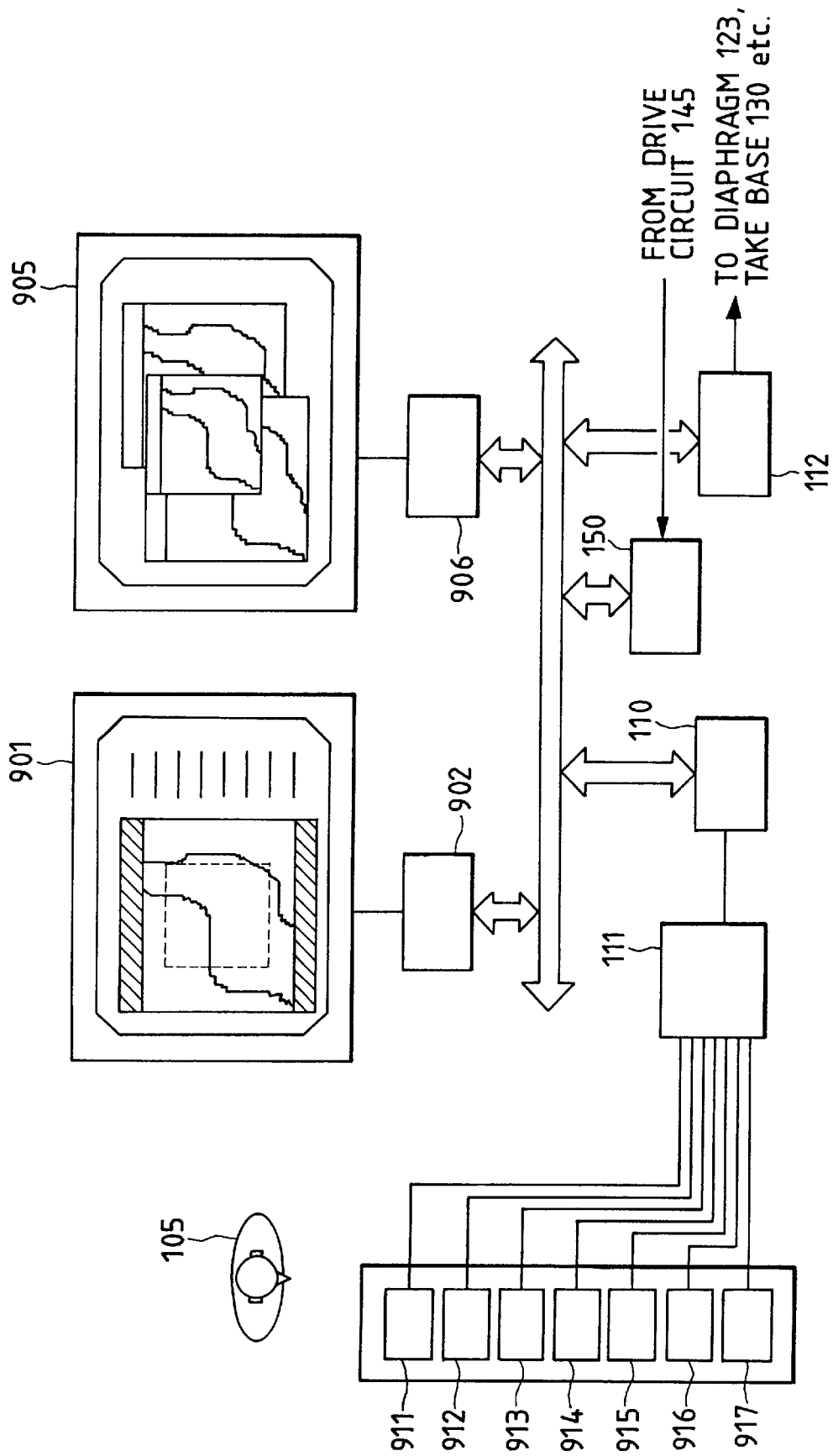
FIG. 20 is a schematic view showing the system configuration of an example of selection of an object area.

In FIG. 20, there are shown a moving image display 901, a display drive circuit 902 therefor, a still image display 905 and a display drive circuit 906 therefor.

An interface 111 to be used by the operator for instructing the image capture area and the X-ray irradiation is provided, for example, with an image capture position controlling lever 911, an image capture size selecting switch 912, an image capture zoom/wide lever 913, a manual X-ray diaphragm lever 914, a radioscopy start switch 915, a radioscopy image enlarging switch 916, and a high-definition image capture switch 917.

The image capture position controlling lever 911 moves the center position of the image capture area. If the instruction by this lever 911 is within the range of the photodetector array 143, the system control unit 110 does not move the specimen table 130 but moves the X-ray diaphragm 123 only, thereby varying the position of the X-ray irradiation. If the instruction is outside the range of the photodetector array 143 but within a range that can be covered by the movement of the specimen table 130, the system control unit 110 moves the specimen table 130. At the same time the X-ray diaphragm 123 is also moved so as to match the center of the photodetector array 143 with that of the X-ray irradiation.

The image capture size selecting switch 912 is to select the size of the image capture size, for example from the following three sizes of image capture.

|   | Vertical × Horizontal | |
|---|---|---|
| 1. | 1 × 1 | (43 × 43 cm) |
| 2. | ¾ × ¾ | (32 × 32 cm) |
| 3. | ½ × ½ | (21 × 21 cm) |

When the operator 105 selects one of these sizes, the system control unit 110 at first moves the specimen table 130 to match the center of the photodetector array 143 with that of the X-ray irradiation, and then drives the X-ray diaphragm 123 to adjust the X-ray irradiation area to the selected image capture size. At the same time the system control unit 110 instructs the drive circuit 145 for the photodetector array 143 to fetch the image of the selected area.

The image capture wide/zoom lever 913 allows to vary the image capture area almost arbitrarily, according to the operation of the operator 105. The image capture area selected by the image capture size selecting switch 912 mentioned above is temporary and can be arbitrarily set by this image capture zoom/wide lever 913. In the variation of the image capture area, if the area overflows the area selectable by the image capture size selecting switch 912, the spatial resolution on the photodetector array 143 at the transmission observation is varied automatically in such overflowing portion. More specifically, the automatic variation of the resolution takes place in the following manner:

|   | Vertical × Horizontal | | Resolution |
|---|---|---|---|
| 1. | 1 × 1 | (43 × 43 cm) or less | ¼ |
| 2. | ¾ × ¾ | (32 × 32 cm) or less | ⅓ |
| 3. | ½ × ½ | (21 × 21 cm) or less | ½ |

Such variation can be achieved by a change in the drive method of the drive circuit 145, so as to effect addition and averaging of 4×4 pixels for a resolution of ¼, 3×3 pixels for a resolution of ⅓ and 2×2 pixels for a resolution of ½. Naturally the averaging of a larger number of pixels reduces the resolution but increases the sensitivity per displayed pixel.

The manual X-ray diaphragm lever 914 is used by the operator 105 for avoiding the X-ray irradiation to unnecessary areas outside the area selected by the image capture zoom/wide lever 913 or for avoiding entry of a strong X-ray, such as flare, into the photodetector array. The manual X-ray diaphragm lever 914 allows the operator 105 to directly manipulate the X-ray diaphragm 123. However, the adjustable range of the X-ray diaphragm 123 is limited by the system control unit 110 in such a manner that the irradiation does not take place over an area wider than that selected by the image capture size selecting switch 912 or by the image capture zoom/wide lever 913.

The radioscopy start switch 915 can be composed of a foot switch, to be used by the operator 105 for instructing the X-ray irradiation for radioscopy. When the start of radioscopy is instructed by the start switch 915, the image capture control unit 112 executes the radioscopy by automatically regulating the X-ray generating condition, based on the output from the X-ray radiation dose monitor 144.

The radioscopy image enlarging switch 916 is actuated, if the resolution in the central portion of the image capture area is to be elevated in the course of radioscopic observation, to display an enlarged image of the central portion, with an improved resolution. At the radioscopic observation, the spatial resolution is reduced in order to achieve high-speed image capture, but, when the radioscopy image enlarging switch 916 is selected, the system control unit 110 reduces the image capture area while maintaining the spatial resolution in an optimum state, thereby displaying an enlarged image on the moving image display 901. At the same time the X-ray diaphragm 123 is set at a size matching the image capture area. When the selection is terminated, the image capture area and the X-ray diaphragm 123 return to the original setting to continue the radioscopic observation.

The high-definition image capture switch 917 is selected in case of capturing a high-definition image at a desired timing in the course of radioscopic observation. This switch is normally provided on the image capture position controlling lever 911. When the capture of a still image is instructed by the switch 917, the X-ray is emitted to the specimen 126 under a predetermined X-ray generating condition for a still image, and a high-definition still image is fetched, processed in the image process unit 150 and displayed on the still image display 905. During the capture of the still image, the moving image display 901 continues to display the radioscopic image immediately before the actuation of the high-definition image capture switch 917.

The image capture area is determined by the configuration explained in the foregoing. The interest area, determined by a desired range of rows and a desired range of columns, is most simply defined as same to the image capture area. In such case, the interest area is determined by the image capture size selecting switch 192 or the image capture zoom/wide lever 913. The image capture in the image capture area is executed, based on the center coordinate of the photodetector array 143 and the coordinates of the image capture area, recognized by the system control unit 110. The X-ray irradiation area may also be defined as the interest area. In this case, the X-ray irradiation area and the center coordinate thereof can be determined by simple calculations, since the position of the X-ray diaphragm 123 is recognized by the system control unit 110. The system control unit 110 controls the drive circuit 145 to execute the image capture, based on such coordinate. An example of sequence for the image capture will be explained later. There may be adopted other configurations in which the operator 105 directly designates the center of the interest area on the moving image display 901 with a pointer such as a mouse, or which extracts the features of an area marked by the operator 105 and automatically controls the X-ray diaphragm 123 and the specimen table 130 in such a manner that the marked portion always comes to the center of the radioscopic image, thus driving the drive circuit 145 maintaining the center of the interest area always at the center of the image capture area.

Figure 21:
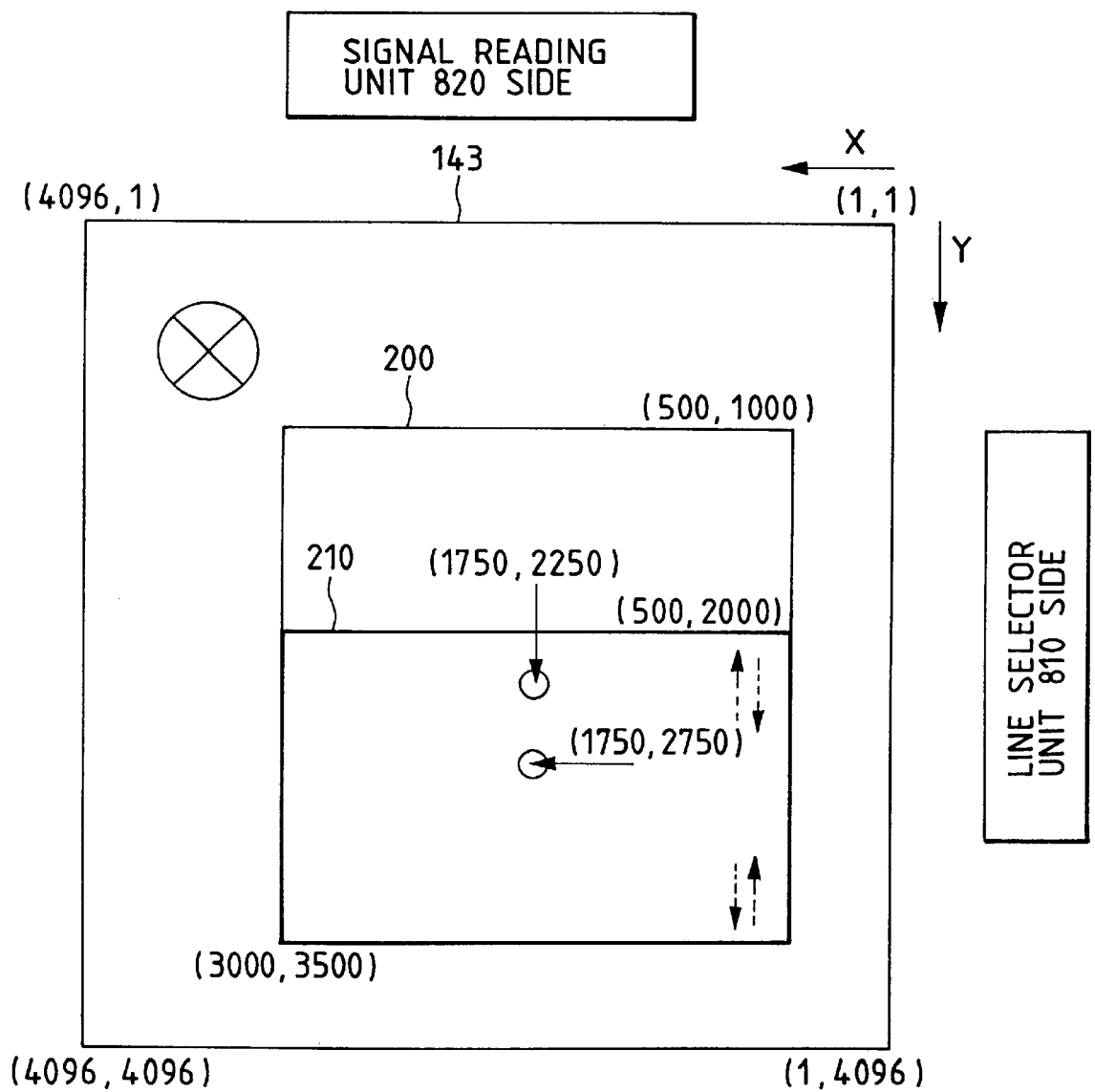
FIG. 21 is a view showing the concept of the object area.

Now reference is made to FIG. 21 for explaining an example of the actual image capturing sequence.

On the photodetector array 143, the X and Y axes are respectively taken in the directions of the row selecting line Lr and the column signal line Lc, and the coordinate of the pixel is represented by (x, y). In FIG. 21, it is assumed that the signal reading unit 820 including the A/D converter 760 etc. is positioned in the upper part of the photodetector array 143 while the line selector unit 810 is provided in the right-hand part, and the X-ray irradiates from the rear side of the drawing toward the front side. The pixels are numbered as (1, 1) at the upper right corner and (4096, 4096) at the lower left corner.

It is also assumed that the center of the image capture area 200 is positioned at (1750, 2250) by the image capture position controlling lever 911, that the image capture area 200 is set in a range of (500, 1000) to (3000, 3500) by the image capture zoom/wide lever 913, and that the X-ray irradiation area 210 is set in a range of (500, 2000) to (3000, 3500) by the manual X-ray diaphragm lever 914. It is also defined that the interest area of the operator 105 coincides with the X-ray irradiation area 210. Under such conditions, the center of the interest area is at (1750, 2250) while the interest area is smaller than ¾×¾ but larger than ½×½ of the area of 4096×4096 pixels, so that addition averaging of 3×3 pixels is executed at the radioscopic observation as explained in the foregoing. Consequently the rows to be read in FIG. 21 at the radioscopic observation are read in the following manner. In the following there is also written an example of radioscopic image capture in case the selected area covers (m+1)-th line to (m+n)-th lines along the Y-axis, wherein n is a multiple of 6.

[Reading order]

The reading order (A), the selected rows (in case of 2001st–3500th rows) (B) and the selected rows (in case of (m+1)th–(m+n)th rows) are correlated as follows:

| Reading order | Selected rows (2001st–3500th rows) | Selected rows ((m + 1)th – (m + n)th rows) |
|---|---|---|
| 1 | 2001, 2002, 2003 | m + 1, m + 2, m + 3 |
| 2 | 3500, 3499, 3498 | m + n, m + n − 1, m + n − 2 |
| 3 | 2004, 2005, 2006 | m + 4, m + 5, m + 6 |
| 4 | 3497, 3496, 3495 | m + n − 3, m + n − 4, m + n − 5 |
| 5 | 2007, 2008, 2009 | m + 7, m + 8, m + 9 |
| 6 | 3494, 3493, 3492, | m + n − 6, m + n − 7, m + n − 8 |
| . | . | . |
| . | . | . |
| 499 = (n/3 − 1) | 2748, 2749, 2750 | m + n/2 − 2, m + n/2 − 1, m + n/2 |
| 500 = (n/3) | 2753, 2752, 2751 | m + n/2 + 3, m + n/2 + 2, m + n/2 + 1 |
| 501 = (n/3 + 1) | 2001, 2002, 2003 | m + 1, m + 2, m + 3 |
| 502 = (n/3 + 2) | 3500, 3499, 3498 | m + n, m + n − 1, m + n − 2 |
| . | . | . |
| . | . | . |

(Hereafter correlation repeats in the same manner.)

If the capture of a high-definition image is instructed by the high-definition image capture switch 917 in the course of a radioscopic observation, the capture of the radioscopic image is interrupted and the image on the moving image display 901 is frozen, and the sequence shifts to a drive routine for the X-ray irradiation area 210 for high-definition image capture. At first the photodetector array 143 is shifted to the refreshing mode and is refreshed. Then the photodetector array 143 is initialized in a driving direction from the periphery of the X-ray irradiation area 210 toward the center thereof, corresponding to the dummy reading operation explained in the foregoing, as exemplified in the following:

| Reading order | Selected rows (2001st–3500th rows) | Selected rows ((m + 1)th – (m + n)th rows) |
|---|---|---|
| 1 | 2001 | m + 1 |
| 2 | 3500 | m + n |
| 3 | 2002 | m + 2 |
| 4 | 3499 | m + n − 1 |
| 5 | 2003 | m + 3 |
| 6 | 3498 | m + n − 2 |
| . | . | . |
| . | . | . |
| 1499 = (n − 1) | 2750 | m + n/2 |
| 1500 = n | 2751 | m + n/2 + 1 |

After the dummy reading operation is repeated plural (two to three) times, the X-ray irradiation is executed with the condition for still image capture. After the X-ray irradiation, the image signals are read in a driving order from the center of the X-ray irradiation area 210 toward the periphery thereof, as exemplified in the following:

| Reading order | Selected rows (2001st–3500th rows) | Selected rows ((m + 1)th – (m + n)th rows) |
|---|---|---|
| 1 | 2750 | m + n/2 |
| 2 | 2751 | m + n/2 + 1 |
| 3 | 2749 | m + n/2 – 1 |
| 4 | 2752 | m + n/2 + 2 |
| 5 | 2748 | m + n/2 – 2 |
| 6 | 2753 | m + n/2 + 3 |
| . | . | . |
| . | . | . |
| . | . | . |
| 1499 = (n – 1) | 2001 | m + 1 |
| 1500 = n | 3500 | m + n |

After such reading operation, the array is immediately shifted to the radioscopic image capture mode.

The above-explained reading drive allows to minimize the signal charge accumulation time for the high-definition image in the central portion of the interest area, thereby suppressing the influence of noises resulting from the dark current.

The area outside the interest area of the present embodiment may be read collectively at the same time or be initialized without signal reading, as already explained in the first and third embodiments.

The collective reading may be executed, not only simultaneously over the entire non-image-reading area, but also by dividing such area into a certain number of portions. Otherwise, after the signals are read from the image-reading area, the collective reading may be executed over all the pixels including those already read.

As explained in the foregoing, the present invention enables high-speed signal reading even in a photoelectric conversion device having a two-dimensional array of plural photoelectric converting elements.

Also the present invention allows to dispense with the time for successively driving unnecessary drive lines and the time for reading unnecessary output signals, thereby enabling to read the signals of a necessary portion at a high speed.

Also the present invention allows to equalize the sensor characteristics of all the photoelectric converting elements, by simultaneously returning the potentials at both ends of the unnecessary photoelectric converting elements to initial values within a short time, thereby providing photoelectrically converted information with higher reliability.

Also the present invention allows to switch a driving method with image trimming and a driving method for reading all the pixels, thereby providing a photoelectric conversion device which can select the reading with all the pixels or the reading with a part of the pixels and is convenient for use.

Furthermore, the present invention allows, in driving an image capture device utilizing a photodetector array, to at first set an interest area and to appropriately select the drive of the photodetector array with respect to such interest area.

Also the present invention allows, particularly in reading high-definition image data, to reset the photoelectric converting elements in succession from the periphery of the interest toward the center thereof, thereby selecting the signal charge accumulation time at the central portion shorter than that at the periphery, thus suppressing the influence of noises which increase together with the charge accumulation time and improving the S/N ratio in the central portion of the interest area.

Furthermore, the present invention allows, in case the photoelectric conversion device is utilized as an X-ray image capture device, particularly in case of a moving image observation by continuous X-ray irradiation on the X-ray image capture device, to reduce the X-ray radiation dose, thereby reducing the influence of radiation, such as X-ray, to the irradiated specimen, the operator of the device and the environment.

Though the foregoing embodiments have been directed to the X-ray image capture, the present invention is not limited to such application but is likewise applicable to any system employing an XY-addressable photodetector array. The present invention is particularly effective in improving the photoelectric converting characteristics, when it is applied to a system employing a photodetector array, in which the photoelectric converting element constituting a light-receiving unit includes a signal charge accumulating unit and a switch unit positioned in a signal reading path and has a tendency to show deterioration in the photoelectric converting characteristics, such as a decrease in the S/N ratio, together with an increase in the signal charge accumulation time.

Naturally the present invention is not limited to the foregoing embodiments and descriptions but is subject to various modifications and combinations within the scope and spirit of the appended claims.

What is claimed is:

1. A method for reading image data from a photodetector array including a matrix array of photosensor elements, comprising steps of:

a) determining an area of the photosensor elements defined by a desired range of rows and a desired range of columns in the photodetector array;

b) detecting the signals of the photosensor elements of a row, from one side of the mutually opposed edges of said determined area;

c) detecting the signals of the photosensor elements of a row, from the other side of the mutually opposed edges of said determined area; and d) alternately repeating the steps b) and c) except for the already detected rows until the signals of the photosensor elements of said determined area are detected.

2. A method for reading image data from a photodetector array including a matrix array of photosensor elements, comprising steps of:

a) determining an area of the photosensor elements defined by a desired range of rows and a desired range of columns in the photodetector array;

b) detecting signals of the photosensor elements of a row of said determined area;

c) detecting signals of the photosensor elements of a row adjacent to one of the two sides of the already detected row;

d) detecting signals of the photosensor elements of a row adjacent to the other of the two sides of the already detected row; and e) alternately repeating the steps c) and d) except for already detected rows until the signals of the photosensor elements of the rows on the mutually opposed edges of said determined area are detected.

3. A drive method for a photoelectric conversion device which is provided with a photodetector array including a matrix array of photosensor elements and in which signals from at least a part of the photosensor elements of each column are taken out from a common column output line through a switching element, comprising steps of:

a) determining an area of the photosensor elements defined by a desired range of rows and a desired range of columns in the photodetector array;

b) taking the signals out to the column output line by driving a switch element corresponding to the photosensor elements of a row from one side of the mutually opposed edges of said determined area;

c) taking the signals out to the column output line by driving a switch element corresponding to the photosensor elements of a row, from the other side of the mutually opposed edges of said determined area; and d) alternately repeating the steps b) and c) except for the already detected rows until the signals of the photosensor elements of the row of said determined area are detected.

4. A drive method for a photoelectric conversion device which is provided with a photodetector array including a matrix array of photosensor elements and in which signals from at least a part of the photosensor elements of each column are taken out from a common column output line through a switching element, comprising steps of:

a) determining an area of the photosensor elements defined by a desired range of rows and a desired range of columns in the photodetector array;

b) taking the signals out to the column output line by driving a switch element corresponding to the photosensor elements of a row of the determined area;

c) taking the signals out to the column output line by driving a switch element corresponding to the photosensor elements of a row adjacent to one of the two sides of the already detected row;

d) taking the signals out to the column output line by driving a switch element corresponding to the photosensor elements of a row adjacent to the other of the two sides of the already detected row; and e) alternately repeating the steps c) and d except for the already detected row until the switch elements corresponding to the photosensor elements of the rows at the mutually opposed edges of the determined area are driven.

5. A photoelectric conversion device provided with a photodetector array including a matrix array of photosensor elements and including also a signal charge accumulation unit and a switch unit provided in the signal output path from such signal charge accumulation unit corresponding to each photosensor element, comprising:

an area determination means for determining as a determined area of the user, an area of the photosensor elements defined by a desired range of rows and a desired range of columns in said photodetector array; and drive means for generating a drive signal for said photodetector array based on the output of said determined area;

wherein said drive means is adapted to generate the drive signal for said photodetector array in such a manner as to reset the charges of said signal charge accumulation units by driving said switch units of said photodetector array in succession from a row at the periphery of said determined area to a row at the center thereof, and, after the exposure to the light, to read the signal charges of said signal charge accumulation units by driving said switch units of said photodetector array in succession from the central portion of said determined area to the peripheral portion thereof.

6. A photoelectric conversion device according to claim 5, further comprising:

read instruction detecting means for detecting a read instruction; and control means for controlling said drive means based on the output of the read instruction detecting means;

wherein the control means is adapted to control said drive means so as to affect the resetting, the exposure after the resetting and the signal reading after the exposure, based on the output of said read instruction detecting means.

7. A photoelectric conversion device according to claim 5, further comprising:

conversion means for converting an X-ray, emitted from X-ray irradiation means, into a visible light;

wherein the visible light emitted from said conversion means is detected by said photodetector array.

8. A photoelectric conversion device according to claim 5, wherein said drive means is adapted to generate a drive signal for said photodetector array, for refreshing said signal charge accumulation units by driving said switch units of said photodetector array in succession from a row in the peripheral portion of the determined area toward a row at the central portion thereof.

9. A device according to claim 5, further comprising a means for switching between a state of obtaining the output from the determined area and a state of obtaining the output from all of the photosensor elements.

* * * * *

UNITED STATES PATENT AND TRADEMARK OFFICE
CERTIFICATE OF CORRECTION

PATENT NO. : 6,690,493 B1
DATED : February 10, 2004
INVENTOR(S) : Kobayashi et al.

It is certified that error appears in the above-identified patent and that said Letters Patent is hereby corrected as shown below:

Column 1,
Line 30, "a-photoelectric" should read -- a photoelectric --.

Column 4,
Lines 4 and 8, "side" should read -- sides --.

Column 6,
Lines 3, 9, 10 and 46, "Shottky" should read -- Schottky --.
Line 33, "Shottky" (both occurrences) should read -- Schottky --.

Column 7,
Lines 5, 6, 7, 14 and 61, "Shottky" should read -- Schottky --.

Column 8,
Line 14, "Shottky" should read -- Schottky --.
Line 67, "al" should read -- all --.

Column 10,
Line 49, "be" should be deleted.

Column 11,
Line 63, "Shottky" should read -- Schottky --.
Line 66, "well" should be deleted.

Column 12,
Line 1, "element" should read -- element are --.

Column 13,
Line 16, "in" should be deleted.

Column 16,
Line 40, "does" should read -- do --.

Column 18,
Line 37, "non-singlecrystalline" should read -- non-single crystalline --.

Column 19,
Line 5, "This" should begin a new paragraph.
Line 19, "the," should read -- the --.
Line 24, "drive" should read -- driven --.

UNITED STATES PATENT AND TRADEMARK OFFICE
CERTIFICATE OF CORRECTION

PATENT NO.   : 6,690,493 B1
DATED        : February 10, 2004
INVENTOR(S)  : Kobayashi et al.

It is certified that error appears in the above-identified patent and that said Letters Patent is hereby corrected as shown below:

Column 23,
Line 10, "thicknesses" should read -- thickness --.

Column 24,
Line 35, "element" should read -- element. --.

Column 28,
Line 63, "C" should read -- G --.

Column 37,
Line 32, "d" should read -- d) --.

Signed and Sealed this

Twenty-ninth Day of June, 2004

JON W. DUDAS
*Acting Director of the United States Patent and Trademark Office*